(12) United States Patent
Sun et al.

(10) Patent No.: US 11,221,650 B2
(45) Date of Patent: *Jan. 11, 2022

(54) ELECTRONIC DEVICE, TERMINAL DEVICE, AND METHOD FOR CONTROLLING ELECTRONIC DEVICE

(71) Applicant: Guangdong Oppo Mobile Telecommunications Corp., Ltd., Guangdong (CN)

(72) Inventors: Zhigang Sun, Guangdong (CN); Xiang Zhang, Guangdong (CN)

(73) Assignee: SHENZHEN HEYTAP TECHNOLOGY CORP., LTD., Shenzhen (CN)

( * ) Notice: Subject to any disclaimer, the term of this patent is extended or adjusted under 35 U.S.C. 154(b) by 317 days.

This patent is subject to a terminal disclaimer.

(21) Appl. No.: 16/365,960

(22) Filed: Mar. 27, 2019

(65) Prior Publication Data
US 2019/0302842 A1    Oct. 3, 2019

(51) Int. Cl.
*G06F 1/16* (2006.01)
*H05K 1/02* (2006.01)
(Continued)

(52) U.S. Cl.
CPC .......... *G06F 1/1624* (2013.01); *G06F 1/1626* (2013.01); *G06F 1/1683* (2013.01);
(Continued)

(58) Field of Classification Search
CPC .... G06F 1/1624; G06F 1/1684; G06F 1/1688; G06F 1/1683; G06F 1/1686;
(Continued)

(56) References Cited

U.S. PATENT DOCUMENTS 6,091,972 A * 7/2000 Ogasawara .......... H04B 1/3833
455/575.7
9,654,610 B1    5/2017 Alavian
(Continued)

FOREIGN PATENT DOCUMENTS

CN    201523400 U    7/2010
CN    201699765 U    1/2011
(Continued)

OTHER PUBLICATIONS

Second Office Action and English Translation issued in corresponding CN application No. 201810282609.0 dated Jan. 18, 2021.
(Continued)

*Primary Examiner* — Marcus Hammonds
(74) *Attorney, Agent, or Firm* — Young Basile Hanlon & MacFarlane, P.C.

(57) ABSTRACT

An electronic device is provided. The electronic device includes a frame, a sliding seat, and a receiver accommodated in the sliding seat. The frame includes a pair of side walls oppositely disposed and a top wall. The top wall defines an accommodating groove. The accommodating groove extends through the pair of side walls. The sliding seat is slidably disposed in the accommodating groove of the frame. The sliding seat defines a first receiving hole, and the receiver is sealed and covers the first receiving hole of the sliding seat, whereby a sound signal of the receiver is transmitted to outside through the first receiving hole when the sliding seat extends from the accommodating groove. In addition, a terminal device and a method for controlling an electronic device are provided.

19 Claims, 18 Drawing Sheets

(51) Int. Cl.
  *H04M 1/02* (2006.01)
  *H04M 1/03* (2006.01)
(52) U.S. Cl.
  CPC .......... *G06F 1/1686* (2013.01); *G06F 1/1688* (2013.01); *G06F 1/1698* (2013.01); *H04M 1/026* (2013.01); *H04M 1/0237* (2013.01); *H04M 1/03* (2013.01); *H05K 1/028* (2013.01)
(58) Field of Classification Search
  CPC .... G06F 1/1626; G06F 1/1698; H04M 1/026; H04M 1/0237; H04M 1/03; H04M 1/0264; H04M 1/0266; H05K 1/028
  See application file for complete search history.

(56) References Cited

U.S. PATENT DOCUMENTS

| | | | |
|---|---|---|---|
| 10,976,774 B2* | 4/2021 | Sun | G06F 1/1626 |
| 2003/0064688 A1* | 4/2003 | Mizuta | H04N 7/147 |
| | | | 455/90.2 |
| 2005/0119034 A1* | 6/2005 | Kato | H04M 1/0237 |
| | | | 455/575.4 |
| 2005/0164751 A1* | 7/2005 | Nishihara | F16C 29/02 |
| | | | 455/575.1 |
| 2005/0250532 A1* | 11/2005 | Hwang | G06F 1/1624 |
| | | | 455/550.1 |
| 2006/0084303 A1* | 4/2006 | Lee | H04M 1/0237 |
| | | | 439/131 |
| 2006/0240881 A1* | 10/2006 | Cho | H04M 1/03 |
| | | | 455/575.4 |
| 2007/0270180 A1* | 11/2007 | Takagi | H04M 1/0237 |
| | | | 455/550.1 |
| 2007/0273786 A1 | 11/2007 | Ahn et al. | |
| 2009/0088222 A1* | 4/2009 | Numano | H04M 1/0235 |
| | | | 455/569.1 |
| 2009/0323292 A1 | 12/2009 | Hwang et al. | |
| 2010/0124955 A1 | 5/2010 | Lin | |
| 2010/0202650 A1* | 8/2010 | Park | H04M 1/03 |
| | | | 381/387 |
| 2017/0026498 A1 | 1/2017 | Goldfain et al. | |

FOREIGN PATENT DOCUMENTS

| | | | |
|---|---|---|---|
| CN | 102138113 | A | 7/2011 |
| CN | 203251333 | U | 10/2013 |
| CN | 204031223 | U | 12/2014 |
| CN | 105554200 | A | 5/2016 |
| CN | 105630079 | A | 6/2016 |
| CN | 205320124 | U | 6/2016 |
| CN | 105842959 | A | 8/2016 |
| CN | 106094990 | A | 11/2016 |
| CN | 106657456 | A | 5/2017 |
| CN | 106713549 | A | 5/2017 |
| CN | 206251153 | U | 6/2017 |
| CN | 107370843 | A | 11/2017 |
| CN | 107734092 | A | 2/2018 |
| CN | 206960841 | U | 2/2018 |
| CN | 207926660 | U | 9/2018 |
| EP | 1528758 | A1 | 5/2005 |
| EP | 3255867 | A1 | 12/2017 |
| GN | 105554196 | A | 5/2016 |
| GN | 106790801 | A | 5/2017 |
| GN | 107800828 | A | 3/2018 |

OTHER PUBLICATIONS

First Examination Report issued in corresponding IN application No. 201914011899 dated Feb. 1, 2021.
English translation of the first office action issued in corresponding CN application No. 201810282609.0 dated Jun. 19, 2020.
Communication pursuant to Article 94(3) EPC issued in corresponding European Application No. 19165514.1 dated Jul. 20, 2020.
Extended European search report issued in corresponding European application No. 19165514.1 dated in May 28, 2019.
International search report issued in corresponding International application No. PCT/CN2019/079537 dated in Jun. 11, 2019.
Extended European Search Report for EP Application 19165502.6 dated May 24, 2019. (8 pages).
International Search Report for PCT Application PCT/CN2019/079534 dated Jun. 26, 2019. (10 pages).
Chinese First Office Action with English Translation for CN Application 201810282608.6 dated Jun. 19, 2020. (18 pages).
Communication pursuant to Article 94(3) EPC for EP Application 19165502.6 dated Jul. 20, 2020. (4 pages).
Chinese Second Office Action with Englsih Translation for CN Application 201810282608.6 dated Jan. 5, 2021. (26 pages).
Indian Examination Report for IN Application 201914011517 dated Apr. 28, 2021. (9 pages).
Non Final Rejection for U.S. Appl. No. 16/365,958 dated Dec. 31, 2019. (21 pages).
Non-Final Rejection for U.S. Appl. No. 16/365,958 dated Oct. 1, 2020. (17 pages).

* cited by examiner

ELECTRONIC DEVICE, TERMINAL DEVICE, AND METHOD FOR CONTROLLING ELECTRONIC DEVICE

CROSS-REFERENCE TO RELATED APPLICATION(S)

This application claims priority to Chinese Patent Application No. 201810282609.0, filed on Mar. 31, 2018, the entire disclosure of which is hereby incorporated by reference.

TECHNICAL FIELD

This disclosure relates to the field of electronic apparatuses, and particularly to an electronic device, a terminal device, and a method for controlling an electronic device.

BACKGROUND

With development of science and technology and requirements of markets, screens of electronic apparatuses are getting increasingly larger. A screen-to-body ratio of an electronic apparatus is restricted by functional components. For example, install and arrangement of a camera module, a receiver module, a flashlight, a sensor, and the like may restrict improvement of the screen-to-body ratio of the electronic apparatus. In the related art, a high screen-to-body ratio of the electronic apparatus is usually achieved by decreasing sizes of the functional components, which can result in high cost.

SUMMARY

An electronic device with flexible arrangement, a terminal device, and a method for controlling an electronic device are provided in the present disclosure.

In a first aspect of the disclosure, an electronic device is provided. The electronic device includes a frame, a sliding seat, and a receiver accommodated in the sliding seat. The frame includes a pair of side walls which are oppositely disposed and a top wall. The top wall defines an accommodating groove. The accommodating groove extends through the pair of side walls. The sliding seat is slidably disposed in the accommodating groove of the frame. The sliding seat defines a first receiving hole, and the receiver is sealed and covers the first receiving hole of the sliding seat, whereby a sound signal of the receiver is transmitted to outside through the first receiving hole when the sliding seat extends from the accommodating groove.

In a second aspect of the disclosure, a terminal device is provided. The terminal device includes an electronic device and a display module. The electronic device includes a frame, a sliding seat, and a receiver accommodated in the sliding seat. The frame includes a pair of side walls which are oppositely disposed and a top wall. The top wall defines an accommodating groove. The accommodating groove extends through the pair of side walls. The sliding seat is slidably disposed in the accommodating groove of the frame. The sliding seat defines a first receiving hole, and the receiver is sealed and covers the first receiving hole of the sliding seat, whereby a sound signal of the receiver is transmitted to outside through the first receiving hole when the sliding seat extends from the accommodating groove. The display module covers the frame and is disposed opposite the sliding seat.

In a third aspect of the disclosure, a method for controlling an electronic device is provided. The method is applicable to an electronic device. The electronic device includes a frame, a sliding seat, and a receiver accommodated in the sliding seat. The frame includes a pair of side walls which are oppositely disposed and a top wall. The top wall defines an accommodating groove. The accommodating groove extends through the pair of side walls. The sliding seat is slidably disposed in the accommodating groove of the frame. The sliding seat defines a first receiving hole, and the receiver is sealed and covers the first receiving hole of the sliding seat. The method includes the following.

The electronic device receives a preset signal, where the preset signal is an extension signal or a retraction signal. The electronic device controls the sliding seat to extend from the accommodating groove according to the preset signal when the preset signal is the extension signal. The electronic device controls the sliding seat to retract into the accommodating groove according to the preset signal when the preset signal is the retraction signal.

BRIEF DESCRIPTION OF DRAWINGS

To describe technical solutions in implementations of the present disclosure more clearly, the following briefly introduces the accompanying drawings required for describing the implementations. Apparently, the accompanying drawings in the following description illustrate some implementations of the present disclosure. Those of ordinary skill in the art may also obtain other drawings based on these accompanying drawings without creative efforts.

DETAILED DESCRIPTION

Technical solutions in implementations of the present disclosure will be described clearly and completely hereinafter with reference to the accompanying drawings in the implementations of the present disclosure. Apparently, the described implementations are merely some rather than all implementations of the present disclosure. All other implementations obtained by those of ordinary skill in the art based on the implementations of the present disclosure without creative efforts shall fall within the protection scope of the present disclosure.

It should be understood that, in the implementations of the present disclosure, directional relationship or positional relationship indicated by such terms as "thickness" is based on the directional relationship or the positional relationship illustrated in the accompanying drawings and is merely for convenience of description and simplicity, rather than explicitly or implicitly indicates devices or elements referred to herein must have a certain direction or be configured or operated in a certain direction and therefore should not be understood as limitation on the disclosure.

Implementations of the disclosure provide an electronic device 100. The electronic device 100 can be any one of electronic apparatuses. Examples of the electronic apparatuses may include smart apparatuses such as a tablet computer, a mobile phone, a camera, a personal computer (PC), a notebook computer, an in-vehicle apparatus, a wearable apparatus, or the like. For convenience of description, directions of the electronic device 100 are defined with reference to a viewing angle illustrated in FIG. 1: a width direction of the electronic device 100 is defined as X-direction, a length direction of the electronic device 100 is defined as Y-direction, and a thickness direction of electronic device 100 is defined as Z-direction.

Figure 2:
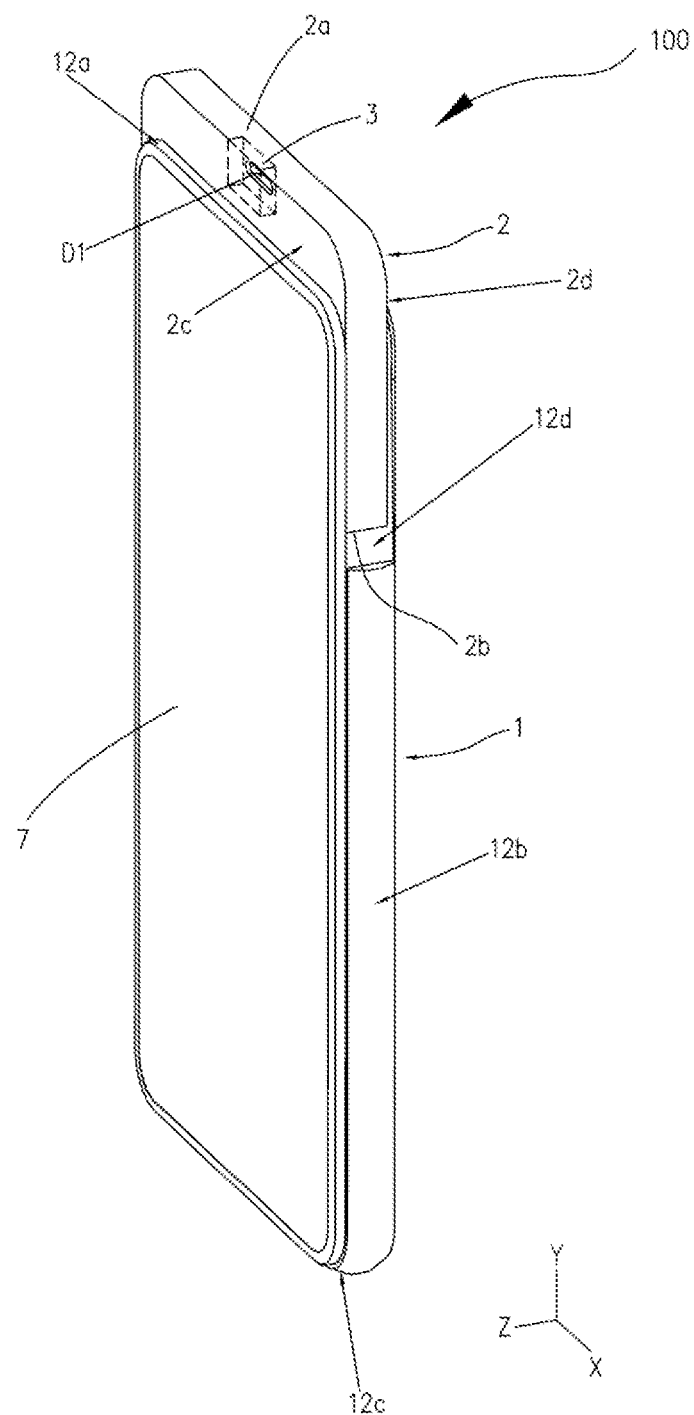
FIG. 2 is a schematic diagram illustrating the electronic device of FIG. 1 in an extending-state.

FIG. 2 is the electronic device 100 according to Implementation 1 of the present disclosure. The electronic device 100 mainly includes a frame 1 and a sliding seat 2. The sliding seat 2 is slidably connected with the frame 1 to enable the electronic device 100 to make the sliding seat 2 extend from or retract into the frame 1 according to actual needs of a user. A receiver (i.e. voice receiver) 3 is received in the sliding seat 2. The sliding seat 2 can slide relative to the frame 1 to enable the receiver 3 to slide out when needed to work, thereby avoiding restriction on a screen-to-body ratio of a display screen of the electronic device 100 resulting from use of the receiver 3, which is beneficial to improving the screen-to-body ratio of the electronic device 100.

Referring to FIG. 2, the electronic device of Implementation 1 includes the frame 1, the sliding seat 2, and the receiver 3 received in the sliding seat 2. The frame 1 includes a pair of side walls 12b which are oppositely disposed and a top wall 12a. The top wall 12a is connected between the pair of side walls 12b. The top wall 12a defines an accommodating groove 12d. The accommodating groove 12d extends through the pair of side walls 12b. The sliding seat 2 is slidably disposed in the accommodating groove 12d of the frame 1. The sliding seat 2 defines a first receiving hole D1, and the receiver 3 is sealed and covers the first receiving hole D1 of the sliding seat, whereby a sound signal(s) of the receiver 3 is transmitted to outside through the first receiving hole D1 when the sliding seat 2 extends from the accommodating groove 12d.

In the electronic device, the receiver 3 is disposed in the sliding seat 2 and the sliding seat 2 is able to slide relative to the frame 1. The sliding seat 2 defines the first receiving hole D1. When the receiver 3 is needed to work, the sliding seat 2 slides out of the frame 1, so that the sound signal of the receiver 3 can be transmitted to outside through the first receiving hole D1. That is, the first receiving hole D1 does not need to be disposed on the display screen of the electronic device 100, which is beneficial to improving the screen-to-body ratio of the electronic device 100.

In the electronic device 100, the top wall 12a of a side frame member 12 defines the accommodating groove 12d, and in this way, the display screen (or a display module 7), the sliding seat 2, and a middle plate 11 of the electronic device 100 form a sandwich structure when the sliding seat 2 is slidably connected with the frame 1. Such a structure guarantees that the display screen and the middle plate 11 can protect the sliding seat 2 inside against crashing when the electronic device 100 drops or is collided by an external force.

Figure 3:
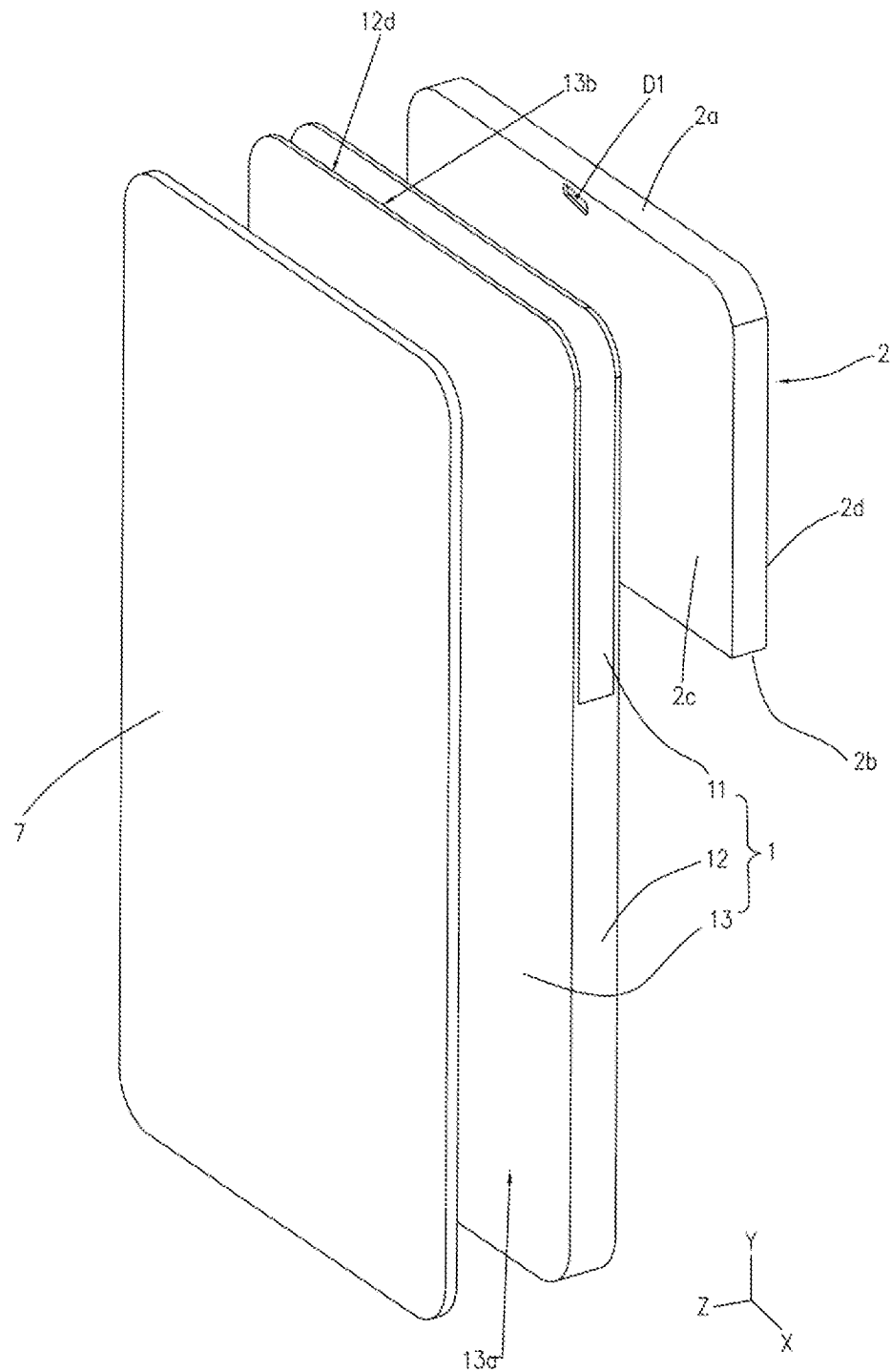
FIG. 3 is a schematic exploded view illustrating the electronic device illustrated in FIG. 2.

As illustrated in FIG. 3, the frame 1 includes the middle plate 11 and the side frame member 12 surrounding the middle plate 11. The side frame member 12 is configured to cover (understood as substantially cover and engage) the display screen to form a complete housing of the electronic device 100. As illustrated in FIG. 2, the middle plate 11 includes the pair of side walls 12b which are oppositely disposed and the top wall 12a and a bottom wall 12c which are connected with the pair of side walls 12b. That is to say, the middle plate 11 is substantially in a rectangular shape. The pair of side walls 12b are also long sides of the electronic device 100. In general, the pair of side walls 12b are configured to arrange a volume button, a card base, and the like of the electronic device 100. The top wall 12a and the bottom wall 12c are short sides of the electronic device 100. Generally, the bottom wall 12c is configured to arrange an earpiece, a speaker, and the like of the electronic device 100.

It should be understood that, the electronic device 100 further includes a support plate 13. The support plate 13 covers the frame 1. In an implementation, the support plate 13 covers the side frame member 12. The support plate 13 includes a first support surface 13a and a second support surface 13b which are oppositely disposed. The first support surface 13a is configured to carry the display module 7. The second support surface 13b is configured to support the sliding seat 2. The support plate 13 can be integrated with the side frame member 12. Alternatively, the support plate 13 and the side frame member 12 can be detachable structures. For example, the support plate 13 is fixed to the side frame member 12 via a screw, riveting, or the like. In this way, the accommodating groove 12d is located between the support plate 13 and the middle plate 11. For the convenience of understanding, refer to FIG. 3. Space inside the frame 1 except the accommodating groove 12d is defined as an inner cavity of the frame 1, that is, the accommodating groove 12d and the inner cavity define a complete inner space of the frame 1.

As illustrated in FIG. 3, a length of the accommodating groove 12d along the X-direction is equal to a length of the frame 1 along the X-direction. In other words, part of the pair of side walls 12b, which is adjacent to the top wall 12a, defines two openings due to existence of the accommodating groove 12d, such that the sliding seat 2 corresponding to the accommodating groove 12d accommodates other functional components besides the receiver 3.

Figure 1:
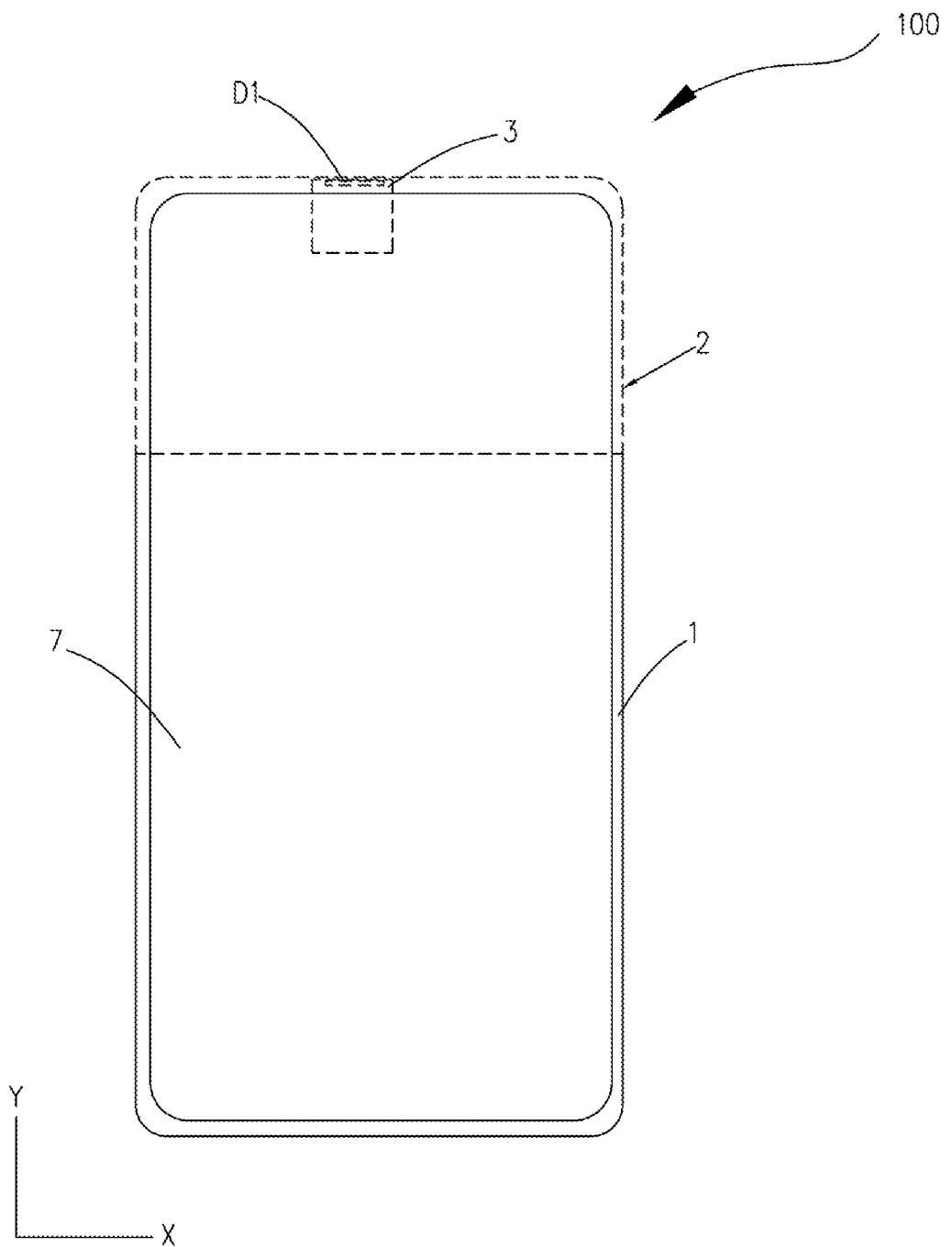
FIG. 1 is a schematic diagram illustrating an electronic device in a retracting-state according to Implementation 1 of the present disclosure.

As illustrated in FIG. 3, the sliding seat 2 has a size corresponding to the accommodating groove 12d, that is, the sliding seat fills in the whole accommodating groove 12d. The sliding seat 2 has a first wall 2a and a second wall 2b which are arranged opposite to each other in Y-direction, and a first sliding surface 2c and a second sliding surface 2d which are arranged opposite to each other in the Z-direction. The first sliding surface 2c of the sliding seat 2 is attached to the support plate 13, and the second sliding surface 2d of the sliding seat 2 is attached to the middle plate 11. Referring to FIG. 2, when the first wall 2a of the sliding seat 2 extends from the top wall 12a for a certain distance, the sliding seat 2 is completely extended from the frame 1. That is to say, the sliding seat 2 is in an extending-state. Referring to FIG. 1, when the first wall 2a of the sliding seat 2 is flush with the top wall 12a, the sliding seat 2 is completely accommodated in the accommodating groove 12d. That is to say, the sliding seat 2 is in a retracting-state.

Referring to FIG. 2, the receiver 3 is disposed in the sliding seat 2, and the first sliding surface 2c of the sliding seat 2 defines the first receiving hole D1. When the receiver 3 is needed to work, the sliding seat 2 can slid accordingly, so that the sliding seat 2 is in an extending-state. In this situation, the first receiving hole D1 on the sliding seat 2 is no longer occluded by the display screen, and the receiver 3 can transmit the sound signal to the outside through the first receiving hole D1. Referring to FIG. 1, when the receiver 3 is not needed to work, the sliding seat 2 can slid accordingly, so that the sliding seat 2 is in a retracting-state, which facilitates the storage of the electronic device 100.

The receiver 3 is disposed adjacent to the first wall 2a of the sliding seat 2, and the vibration portion 3a of the receiver 3 faces the first sliding surface 2c of the sliding seat 2 and communicates with the first receiving hole D1 on the first sliding surface 2c. In this situation, after a vibration portion 3a of the receiver 3 vibrates to generate the sound signal, the sound signal can be transmitted to the outside through the first receiving hole D1, thereby realizing the receiving function of the receiver 3.

The manner in which the receiver 3 is disposed on the sliding seat includes but is not limited to the following.

Figure 4:
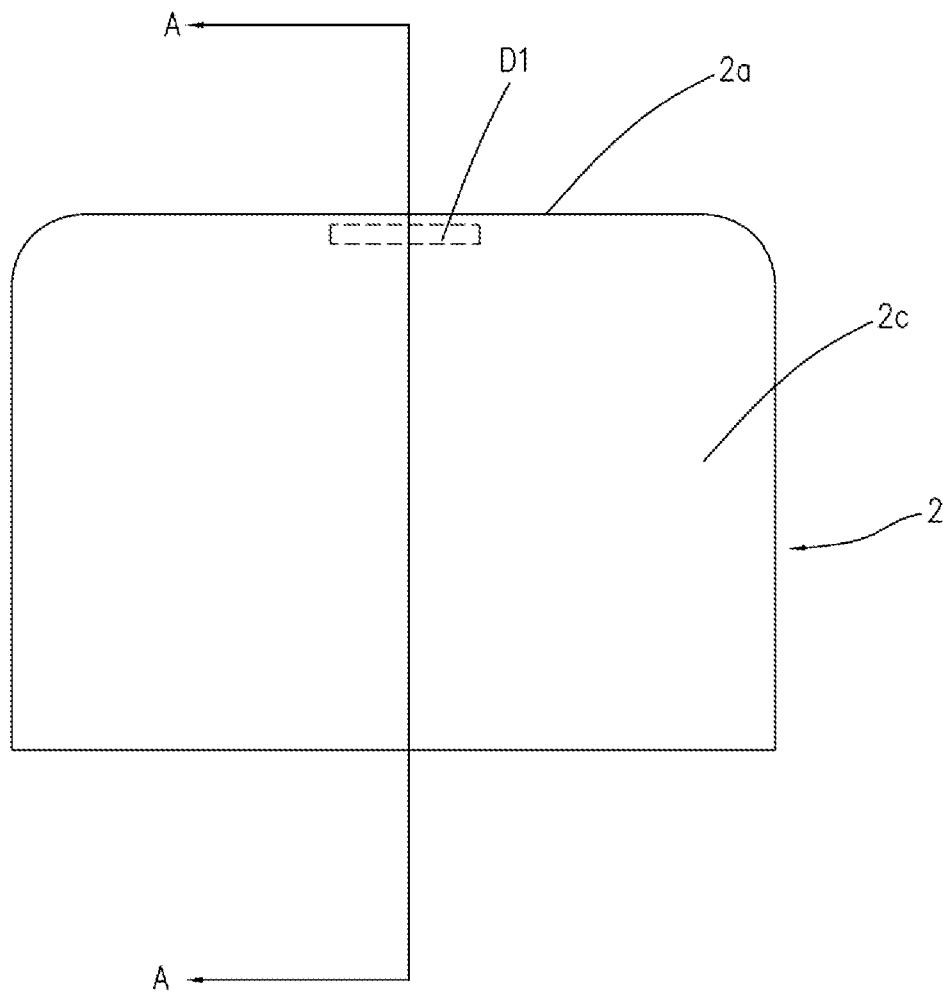
FIG. 4 is a schematic diagram illustrating the sliding seat illustrated in FIG. 3.
Figure 5:
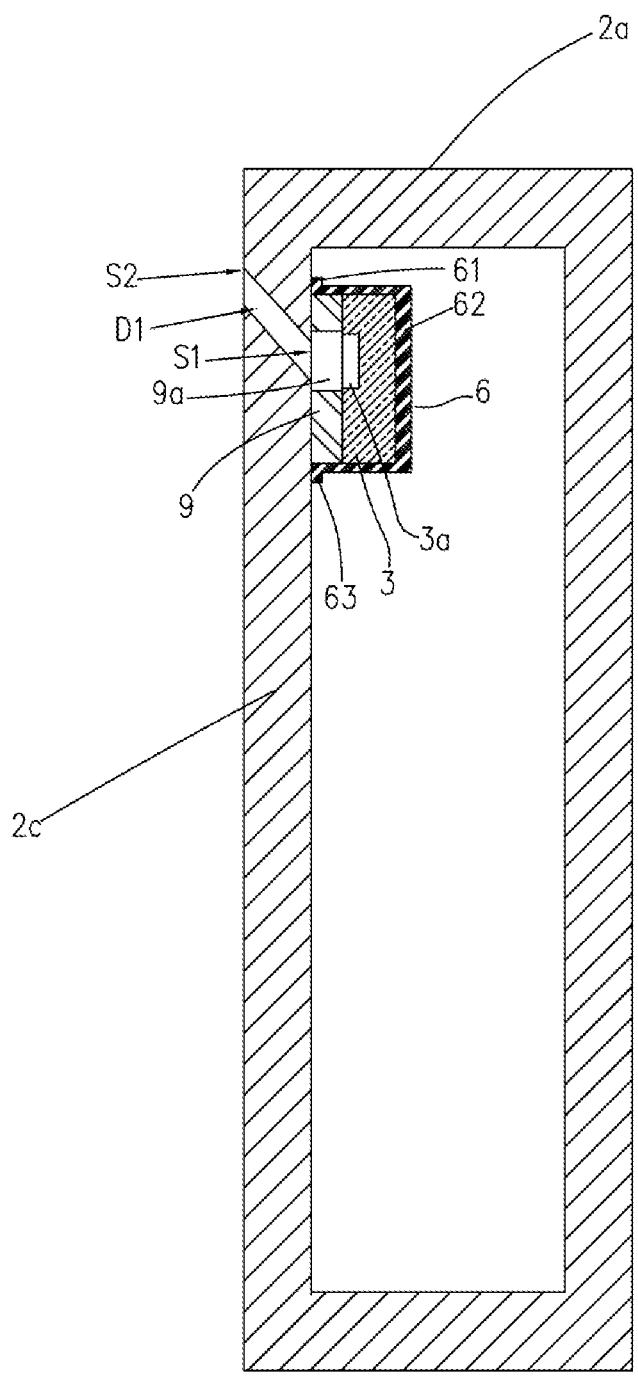
FIG. 5 is a cross-sectional view illustrating the sliding seat illustrated in FIG. 4 along line A-A.

In one implementation, referring to FIG. 4 and FIG. 5, the electronic device 100 further includes a bracket 6 and a sealing member 9. The sealing member 9 has a hollow portion 9a and is disposed between the receiver 3 and the sliding seat 2. The hollow portion 9a communicates with a vibration portion 3a of the receiver 3 and the first receiving hole D1 of the sliding seat 2 respectively. The bracket 6 is pressed on the receiver 3. With this structure, the sealing member 9 is sandwiched between the receiver 3 and the sliding seat 2.

Referring to FIG. 5, the sealing member 9 is made of foam and has elasticity. The sealing member 9 is pressed between the receiver 3 and the sliding seat 2, to achieve a tight contact between the sealing member 9 and the receiver 3, and prevent the sound signal of the receiver 3 from leaking out of a junction of the receiver 3 and the sealing member 9, where the leaking affects the output of the sound signal of the receiver 3. A diameter of the hollow portion 9a of the sealing member 9 is slightly larger than a diameter of the vibration portion 3a of the receiver 3, so that the sound generated by the vibration of the vibration portion 3a can be completely transmitted to the hollow portion 9a. In other implementations, the diameter of the hollow portion 9a of the sealing member 9 can also be the same as the diameter of the vibration portion 3a of the receiver 3.

Referring to FIG. 5, the bracket 6 covers the receiver 3 and is fixed to the sliding seat 2 to provide a fastening force so that the sealing member 9 can be pressed between the receiver 3 and the sliding seat 2. With the bracket 6 and the sealing member 9, the receiver 3 is sealed and connected with the first receiving hole D1. In this way, sealing performance between the receiver 3 and the first receiving hole D1 can be ensured, and disassembly and assembly of the receiver 3 on the sliding seat 2 can be facilitated.

As illustrated in FIG. 5, the bracket 6 has a first connecting portion 61, a pressing portion 62, and a second connecting portion 63 which are sequentially connected, the pressing portion 62 covers the receiver 3, and the first connecting portion 61 and the second connecting portion 63 both extend in a direction away from the pressing portion 62 and are fixedly connected with the sliding seat 2.

The bracket 6 has a substantially "Ω" shape. The pressing portion 62 of the bracket 6 fully covers the entire receiver 3. The first connecting portion 61 and the second connecting portion 63 are screwed to the sliding seat 2. In other implementations, the bracket 6 may also be U-shaped and snap-fitted with the sliding seat 2.

Figure 6:
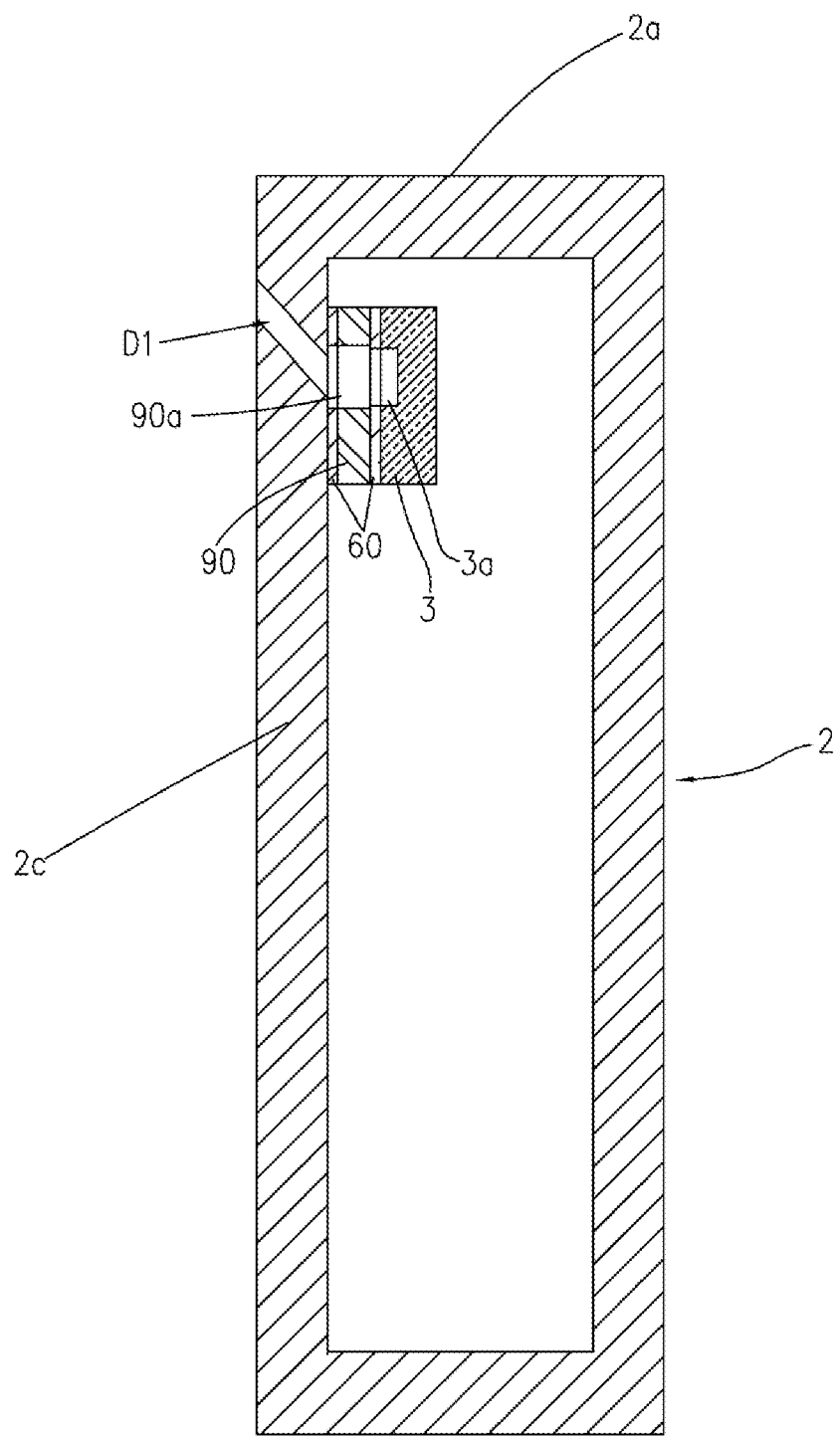
FIG. 6 is a cross-sectional view illustrating another sliding seat illustrated in FIG. 4 along line A-A.

In another implementation, referring to FIG. 6, the electronic device 100 further includes an elastic member 90 and an adhesive 60. The elastic member 90 is adhered between the receiver 3 and the sliding seat 2 via the adhesive 60. The elastic member 90 has a hollowed-out portion 90a, and the hollowed-out portion 90a communicates with a vibration portion 3a of the receiver 3 and the first receiving hole D1 of the sliding seat 2 respectively.

The elastic member 90 is made of foam. The adhesives 60 are provided on two opposite walls of the elastic member 90. One of the two walls of the elastic member 90 is adhered to the receiver 3 via the adhesive 60, and the other of the two walls of the elastic member 90 is adhered to the sliding seat 2 via the adhesive 60. A diameter of the hollowed-out portion 90a is slightly larger than a diameter of the vibration portion 3a of the receiver 3, so that the sound generated by the vibration of the vibration portion 3a can be completely transmitted to the hollowed-out portion 90a.

With the elastic member 90 and the adhesive 60, the receiver 3 is sealed and covers the first receiving hole D1, that is, the receiver 3 is connected with the first receiving hole D1 in a seal manner. In this way, sealing performance between the receiver 3 and the first receiving hole D1 can be ensured, and disassembly and assembly of the receiver 3 on the sliding seat 2 can be facilitated.

A structure of the first receiving hole D1 includes but is not limited to the following.

In one implementation, as illustrated in FIG. 5, the first receiving hole D1 has a first opening S1 and a second opening S2 disposed opposite to each other. The first opening S1 is located on an inner surface of the sliding seat 2, and the second opening S2 gradually extends toward a direction away from the first opening S1 and gradually approaches the first wall 2a. In other implementations, the first receiving hole D1 is a through hole. That is, a central axis of the first receiver hole D1 is perpendicular to the first sliding surface. A hole-wall of the through hole facilitates reducing the transmission path of the sound signal of the receiver.

Referring to FIG. 4, the first receiving hole D1 is substantially a hole inclined with respect to the first sliding surface 2c. The first receiving hole D1 is defined as an inclined hole, and thus the receiver 3 does not need to be disposed too close to the first wall 2a of the sliding seat 2, as long as the sliding seat 2 is extended from the accommodating groove 12d, the sound signal of the receiver 3 can be transmitted to the outside, and at the same time, it is possible to make room for other components to be placed close to the first wall 2a of the sliding seat 2. A distance between the first opening S1 of the first receiving hole D1 and the first wall 2a is greater than a distance between the second opening S2 of the first receiving hole D1 and the first wall 2a.

It can be understood that, the second opening S2 of the first receiving hole D1 can be close to a junction of the first wall 2a and the first sliding surface 2c.

The first opening S1 and the second opening S2 have the same shape and are substantially long rectangular.

Referring to FIG. 2, when the receiver 3 is needed to work, the sliding seat 2 can be correspondingly moved to be in the extending-state. In this case, the first receiving hole D1 on the sliding seat 2 are no longer occluded by the display screen. The receiver 3 is able to transmit the sound signal to the outside through the first receiving hole D1. Referring to FIG. 1, when the receiver 3 is not needed to work, the sliding seat 2 can be correspondingly moved to be in the retracting-state, which facilitates the accommodation of the electronic device 100.

According to the electronic device, the receiver 3 is disposed in the sliding seat 2, and the sliding seat 2 is able to slide relative to the frame 1 and defines the first receiving hole D1. When the receiver 3 is needed to work, the sliding seat 2 slides out of the frame 1, so that the sound signal of the receiver 3 can be transmitted to outside through the first receiving hole D1. That is, the first receiving hole D1 does not need to be disposed on the display screen of the electronic device 100, which is beneficial to improving the screen-to-body ratio of the electronic device 100.

Figure 7:
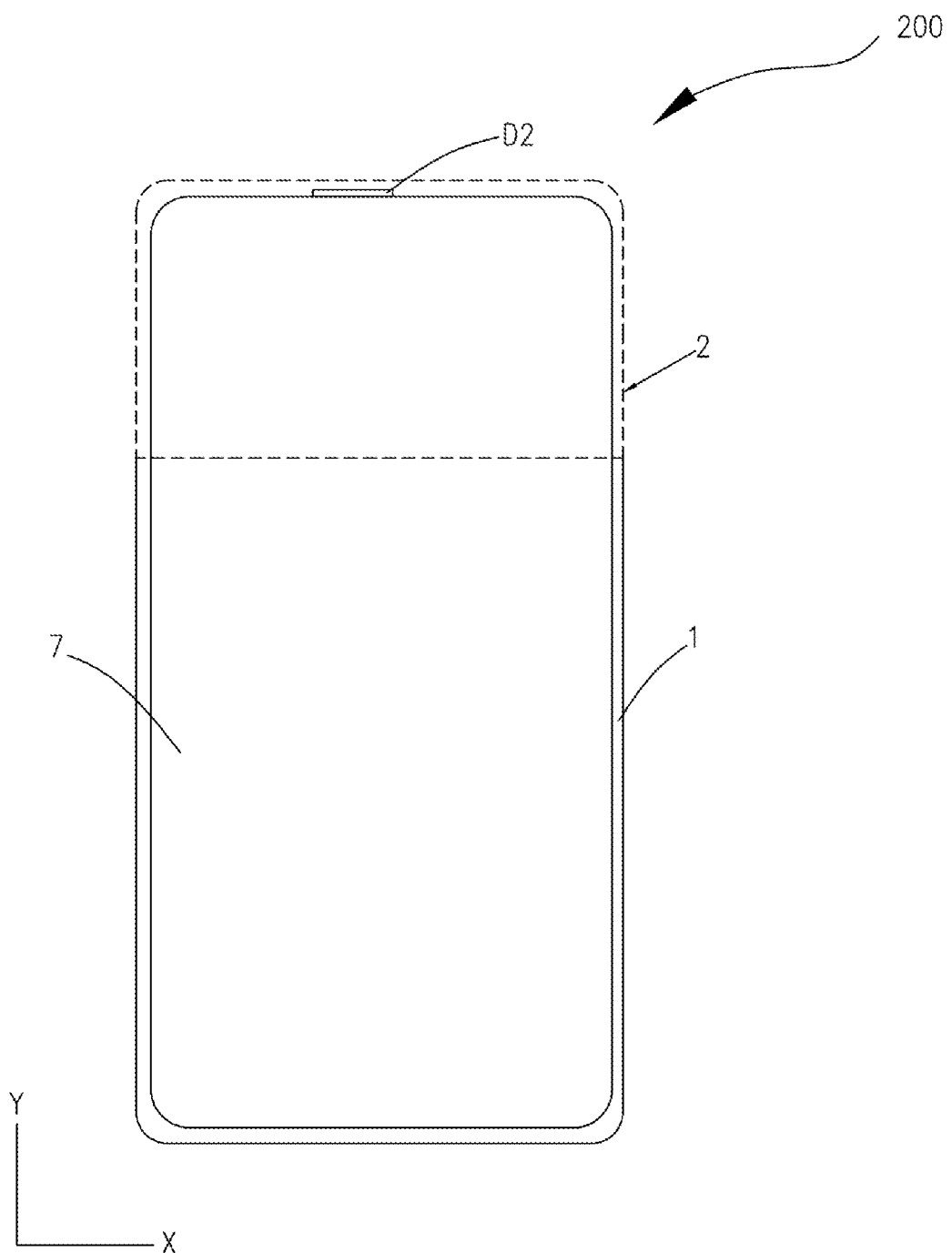
FIG. 7 is a schematic diagram illustrating an electronic device in a retracting-state according to Implementation 2 of the present disclosure.
Figure 8:
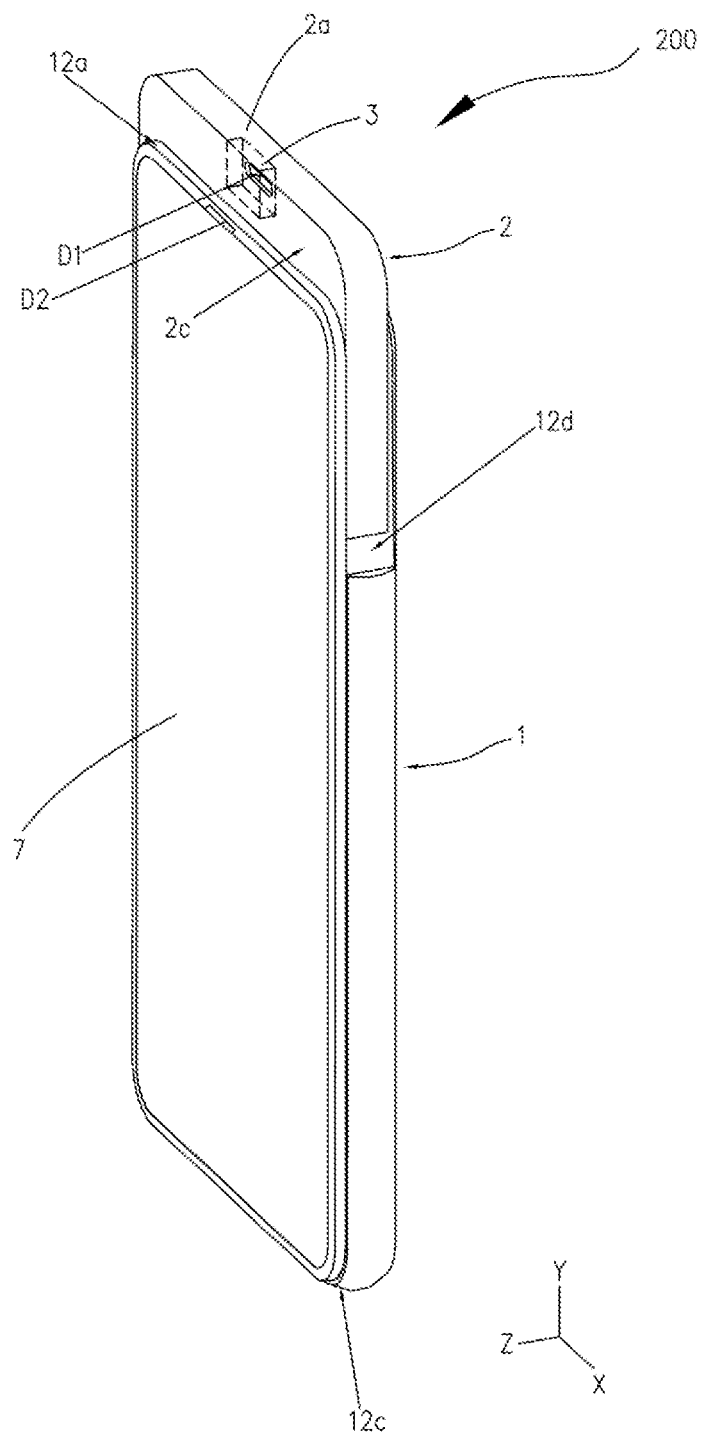
FIG. 8 is a schematic diagram illustrating the electronic device of FIG. 7 in an extending-state.

As illustrated in FIG. 7 and FIG. 8, a structure of an electronic device 200 according to Implementation 2 of the disclosure is similar to the structure of the electronic device 100 according to Implementation 1 of the disclosure. The difference is mainly as follows. The frame 1 defines a second receiving hole D2. The second receiving hole D2 communicates with the first receiving hole D1 when the sliding seat 2 is accommodated in the accommodating groove 12d, whereby the sound signal of the receiver 3 is output to the second receiving hole D2 via the first receiving hole D1 when the sliding seat 2 is accommodated in the accommodating groove 12d.

The second receiving hole D2 is defined in the frame 1, so that the receiver 3 can be used no matter the sliding seat 2 is in the extending-state or the retracting-state, thereby further improving the reliability of the electronic device 200.

Referring to FIG. 7, when the sliding seat 2 is accommodated in the accommodating groove 12d, an area of orthographic projection of the second receiving hole D2 on the sliding seat is at least partially overlapped with an area occupied by the first receiving hole D1 in the sliding seat 2. In this way, after output from the first receiving hole D1, the sound signal of the receiver 3 can be continuously transmitted to the second receiving hole D2 and further transmitted to the outside through the second receiving hole D2, thereby achieving the receiving function of the receiver 3 when the sliding seat 2 is in the retracting-state. It should be understood that, the area of orthographic projection of the second receiving hole D2 on the sliding seat is within an area occupied by the first receiving hole D1 in the sliding seat 2.

For example, the area of orthographic projection of the second receiving hole D2 on the sliding seat is half of an area occupied by the first receiving hole D1 in the sliding seat 2.

Referring to FIG. 7, an edge of the top wall 12a of the frame 1 is notched to define the second receiving hole D2. The electronic device 200 further includes a display module 7. The display module 7 covers the frame 1, and the display module 7 and the sliding seat defines the second receiving hole D2.

Referring to FIG. 7, the second receiving hole D2 is a semi-closed hole. In other words, the second receiving hole D2 is a groove defined on the edge of the top wall 12a. The second receiving hole D2 is not in communication with an opening of the accommodating groove 12d on the top wall 12a. The second receiving hole D2 is limited to the above configuration, such that the influence on a strength of the frame 1 can be reduced. The second receiving hole D2 is matched with the display module 7 to make the second receiving hole D2 be a closed hole, which effectively utilizes connection relationship between the display module 7 and the frame 1, and ensures the strength of the frame 1 while ensuring that better sound signals can pass through the second receiving hole D2.

The second receiving hole D2 is substantially long rectangular.

The manner in which the first receiving hole D2 and the second receiving hole D2 communicate with each other includes but is not limited to the following.

In one implementation, referring to FIG. 8, the first sliding surface 2c of the sliding seat 2 is attached to the frame 1, so that when the sliding seat 2 is retracted into the accommodating groove 12d, there is no gap between the first receiving hole D1 and the second receiving hole D2 or the gap is small and thus the sound signal of the receiver 3 can be transmitted through the first receiving hole D1 and the second receiving hole D2 to the outside. The first receiving hole D1 and the second receiving hole D2 are connected in a simple manner and have a low manufacturing cost.

Figure 9:
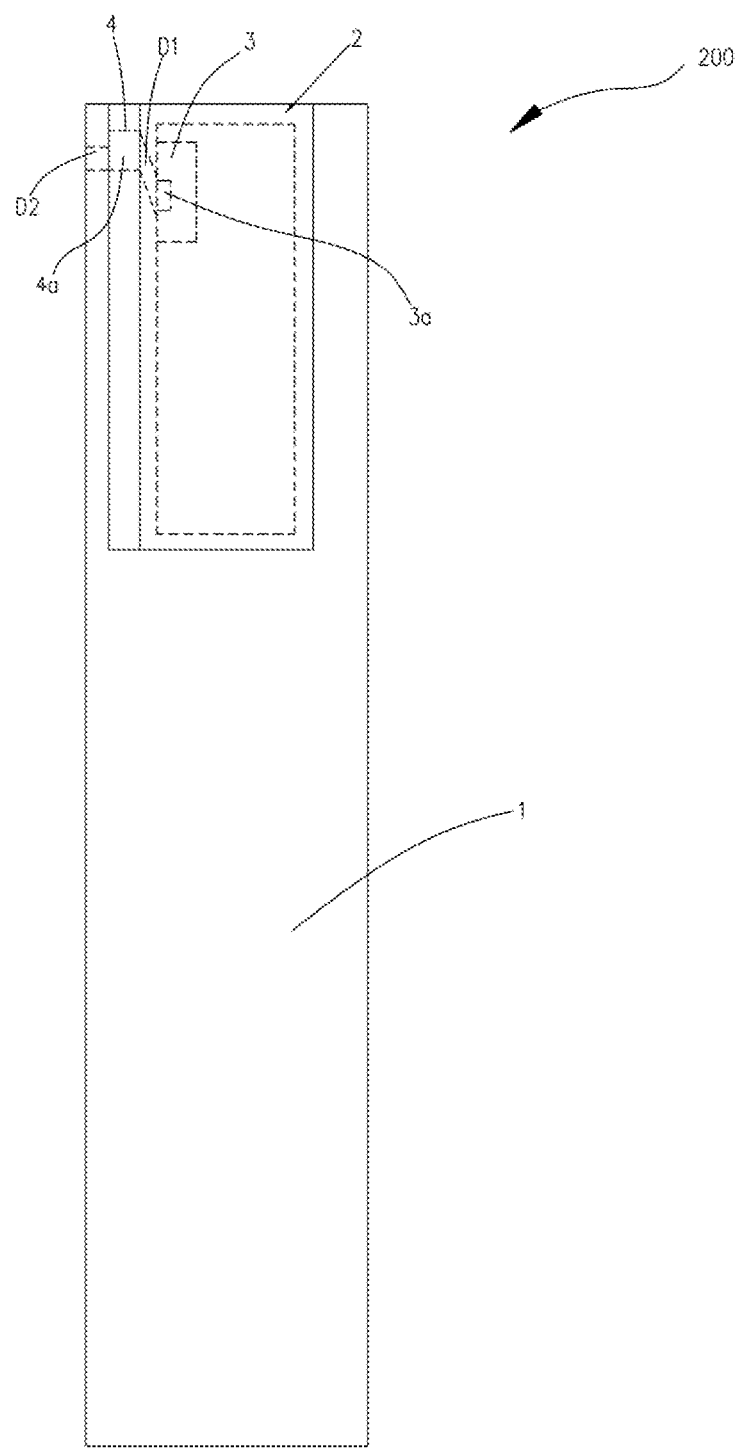
FIG. 9 is a schematic diagram illustrating a sound-transmission assembly provided for the electronic device illustrated in FIG. 8.

In another implementation, referring to FIG. 9, the electronic device 200 further includes a sound-transmission assembly 4. The sound-transmission assembly 4 has an inner cavity 4a. The first receiving hole D1 communicates with the second receiving hole D2 via the inner cavity 4a. With this structure, the sound signal of the receiver 3 is sequentially transmitted through the first receiving hole D1, the inner cavity 4a, and the second receiving hole D2.

The sound-transmission assembly 4 is disposed between the sliding seat 2 and the frame 1, so that the sound signal transmitted from the first receiving hole D1 is directly transmitted to the second receiving hole D2 through the inner cavity 4a of the sound-transmission assembly 4, thereby avoiding leaking of the sound signal during transmitting from the first receiving hole D1 to the second receiving hole D2, further improving sound quality of the electronic device 200.

A structure of the sound-transmission assembly 4 includes but is not limited to the following.

Figure 10:
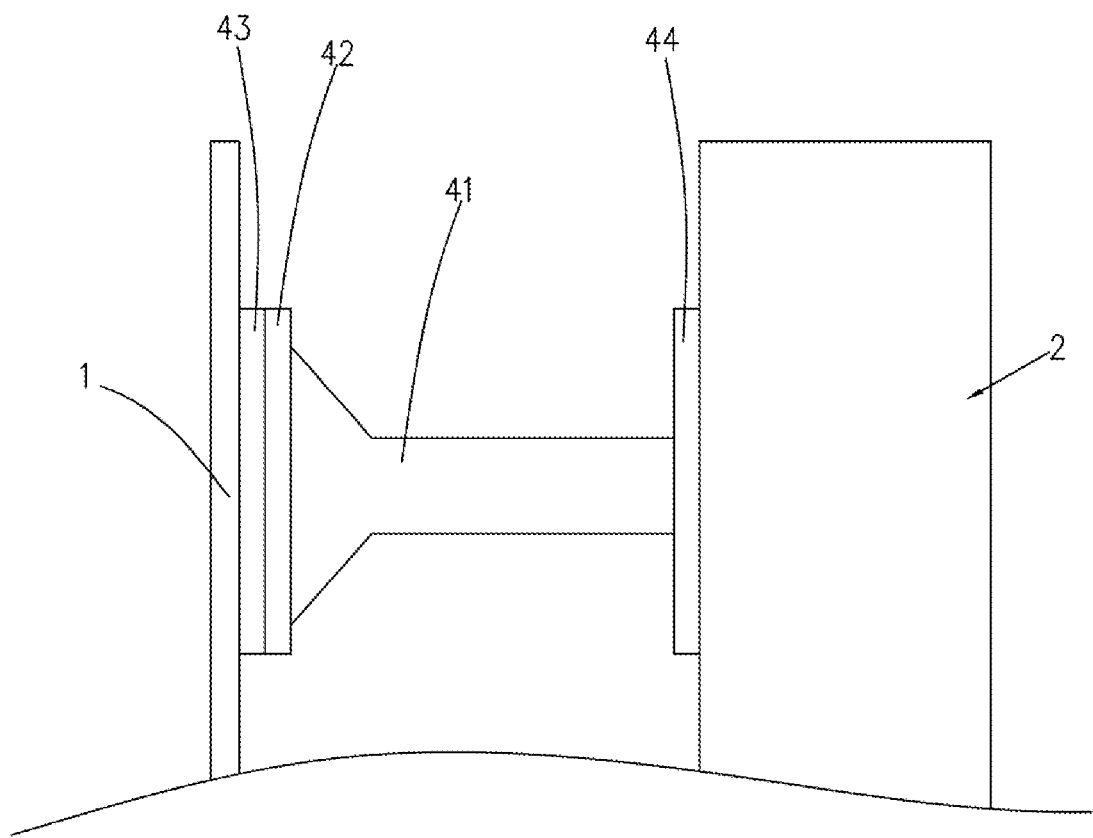
FIG. 10 is a schematic diagram illustrating a state of a sound-transmission assembly provided for the electronic device illustrated in FIG. 9.
Figure 11:
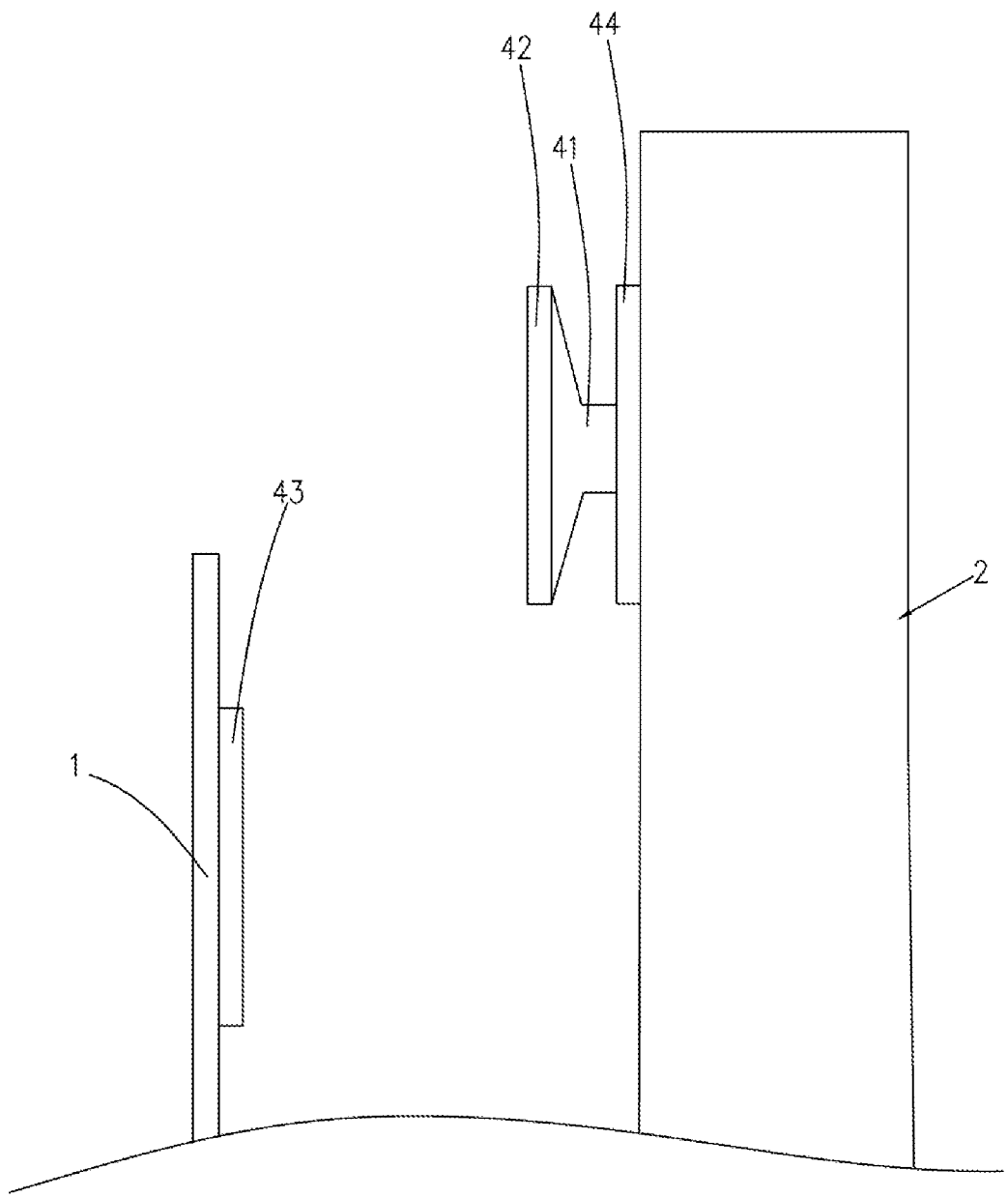
FIG. 11 is a schematic diagram illustrating another state of the sound-transmission assembly illustrated in FIG. 10.

In one implementation, referring to FIG. 10 and FIG. 11, the sound-transmission assembly 4 includes a sound-transmission tube 41, a first magnetic member 42, a second magnetic member 43, and a third magnetic member 44. The sound-transmission tube 41 has one end fixedly coupled with the sliding seat 2 and communicating with the first receiving hole D1. The first magnetic member 42 is disposed on the other end of the sound-transmission tube 41. The second magnetic member 43 is disposed on the frame 1 and surrounds the second receiving hole D2. The third magnetic member 44 is disposed on the sliding seat 2. A magnetic force between the first magnetic member 42 and the second magnetic member 43 is greater than a magnetic force between the first magnetic member 42 and the third magnetic member 44, whereby the other end of the sound-transmission tube 41 communicates with the second receiving hole D2 because of magnetic attraction of the first magnetic member 42 and the second magnetic member 43 when the sliding seat 2 is accommodated in the accommodating groove 12d, or the other end of the sound-transmission tube 41 is attached to the sliding seat 2 because of magnetic attraction of the first magnetic member 42 and the third magnetic member 44 when the sliding seat 2 extends from the accommodating groove 12d.

The sound-transmission tube 41 is a hose. Referring to FIG. 10, when the sliding seat 2 is gradually restricting into the accommodating groove 12d, as the other end of the sound-transmission tube 41 is provided with the first magnetic member 42, the magnetic attraction of the first magnetic member 42 and the second magnetic member 43 increased as their approaching and the first magnetic member 42 will move away from the third magnetic member 44 and attached to the second magnetic member 43, thereby realizing that the other end of the sound-transmission tube 41 is sealed and covers the second receiving hole D2. Referring to FIG. 11, when the sliding seat 2 is gradually extending from the accommodating groove 12d, the first magnetic member 42 on the other end of the sound-transmission tube 41 will gradually separate with the second magnetic member 43 because of an external force, and the first magnetic member 42 will be attracted by and move close to the third magnetic member 44, realizing the accommodation of the other end of the sound-transmission tube 41.

The structure of the sound-transmission assembly 4 ensures that the first receiving hole D1 can communicate with the second receiving hole D2 when the sliding seat 2 is retracted into the accommodating groove 12d, and the sound-transmission tube 41 can be accommodated by attaching to the sliding seat 2 after the sliding seat 2 is extended from the accommodation groove 12d.

The first magnetic member 42, the second magnetic member 43, and the third magnetic member 44 are annular blocks. The first magnetic member 42 surrounds the other end of the sound-transmission tube 41. The second magnetic member 43 surrounds the second receiving hole D2. The third magnetic member 44 surrounds the first receiving hole D1.

It can be understood that, a diameter of the other end of the sound-transmission tube 41 is larger than a diameter of one end of the sound-transmission tube 41, such that when the other end of the sound-transmission tube 41 is attracted to the third magnetic member 44 on the sliding seat 2 via the first magnetic member 42, the other end of the sound-transmission tube 41 can sleeve itself reversely, and the sound signal of the first receiving hole D1 can be transmitted from the sound-transmission tube 41.

Figure 12:
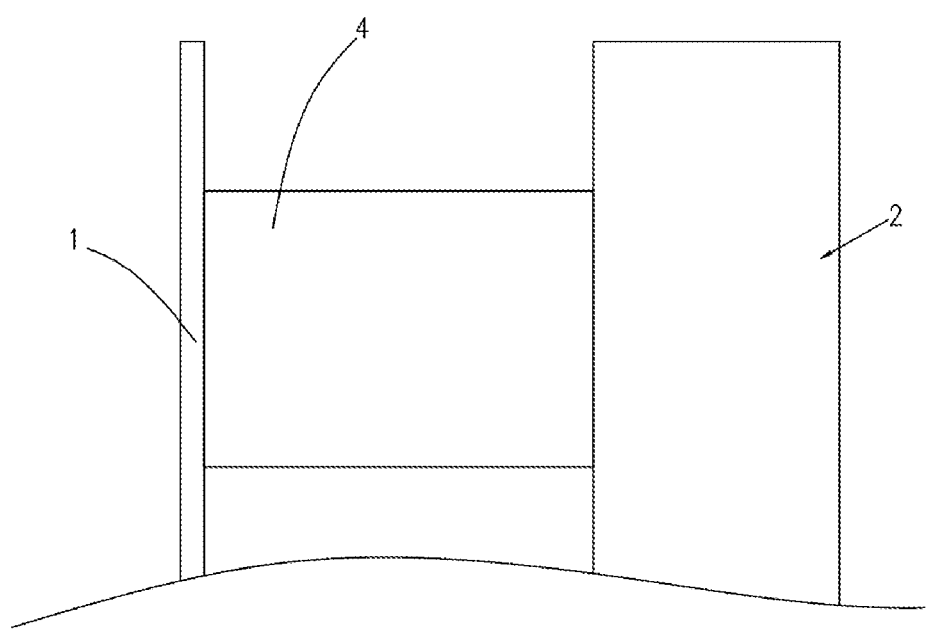
FIG. 12 is a schematic diagram illustrating another sound-transmission assembly provided for the electronic device illustrated in FIG. 9.

In another implementation, referring to FIG. 12, the sound-transmission assembly 4 is a sound-transmission rod. The sound-transmission rod protrudes from the sliding seat 2 and surrounds the first receiving hole D1. The sound-transmission rod has an end extending in a direction away from the sliding seat 2. With this structure, the end of the sound-transmission rod abuts against the frame 1 and surrounds the second receiving hole D2 when the sliding seat 2 is accommodated in the accommodating groove 12d.

Referring to FIG. 9 and FIG. 12, a length of the sound-transmission rod along the Z-direction is equal to a distance between the first receiving hole D1 on the sliding seat 2 and the second receiving hole D2 on the frame 1. In this way, after the sliding seat 2 is retracted into the accommodating groove 12d, the end of the sound-transmission rod is attached to the frame 1 to achieve a tight connection between the end of the sound-transmission rod and the second receiving hole D2. Therefore, the sound signal transmitted from the first receiving hole D1 is directly transmitted to the second receiving hole D2 through the sound-transmission rod, thereby avoiding leaking of the sound signal during transmitting from the first receiving hole D1 to the second receiving hole D2, further improving sound quality of the electronic device 200.

When the sliding seat 2 is in the extending-state, the sound signal of the receiver 3 can be transmitted to the outside through the first receiving hole D1 to achieve the receiving function of the receiver 3; when the sliding seat 2 is in the retracting-state, the sound signal of the receiver 3 can be transmitted to the outside through the first receiving hole D1 and the second receiving hole D2 sequentially to achieve the receiving function of the receiver 3.

The electronic device 200 of the implementations can achieve the receiving function of the receiver 3 when the sliding seat 2 is in the extending-state or the retracting-state.

Furthermore, the electronic device of the implementations of the disclosure further includes at least one functional component 5. The at least one functional component 5 is disposed in the sliding seat 2. The sliding seat 2 is provided with at least one functional portion 5a, through which the at least one functional component 5 is able to transmit a signal.

The at least one functional component 5 is disposed in the sliding seat 2, and the sliding seat 2 is slidable relative to the frame 1. In this way, when the multiple functional components 5 are needed to work, the sliding seat 2 is driven to slide out of the frame 1 to make the at least one functional portion 5a extend from the frame 1 to transmit a signal, that is, there is no need to dispose the at least one functional portion 5a corresponding to the multiple functional components 5 on the display screen of the electronic device, which is beneficial to improving the screen-to-body ratio of the electronic device.

Figure 13:
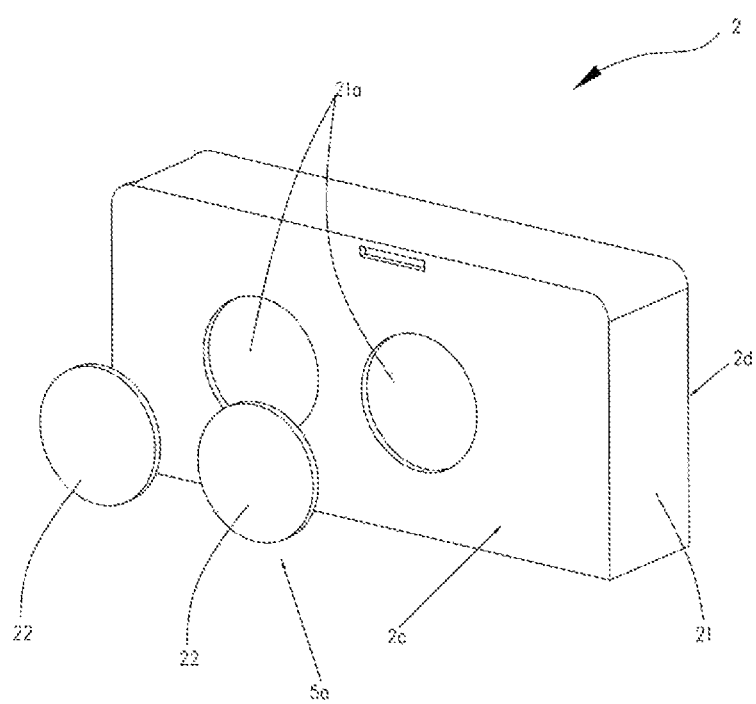
FIG. 13 is a schematic diagram illustrating the sliding seat illustrated in FIG. 2.
Figure 14:
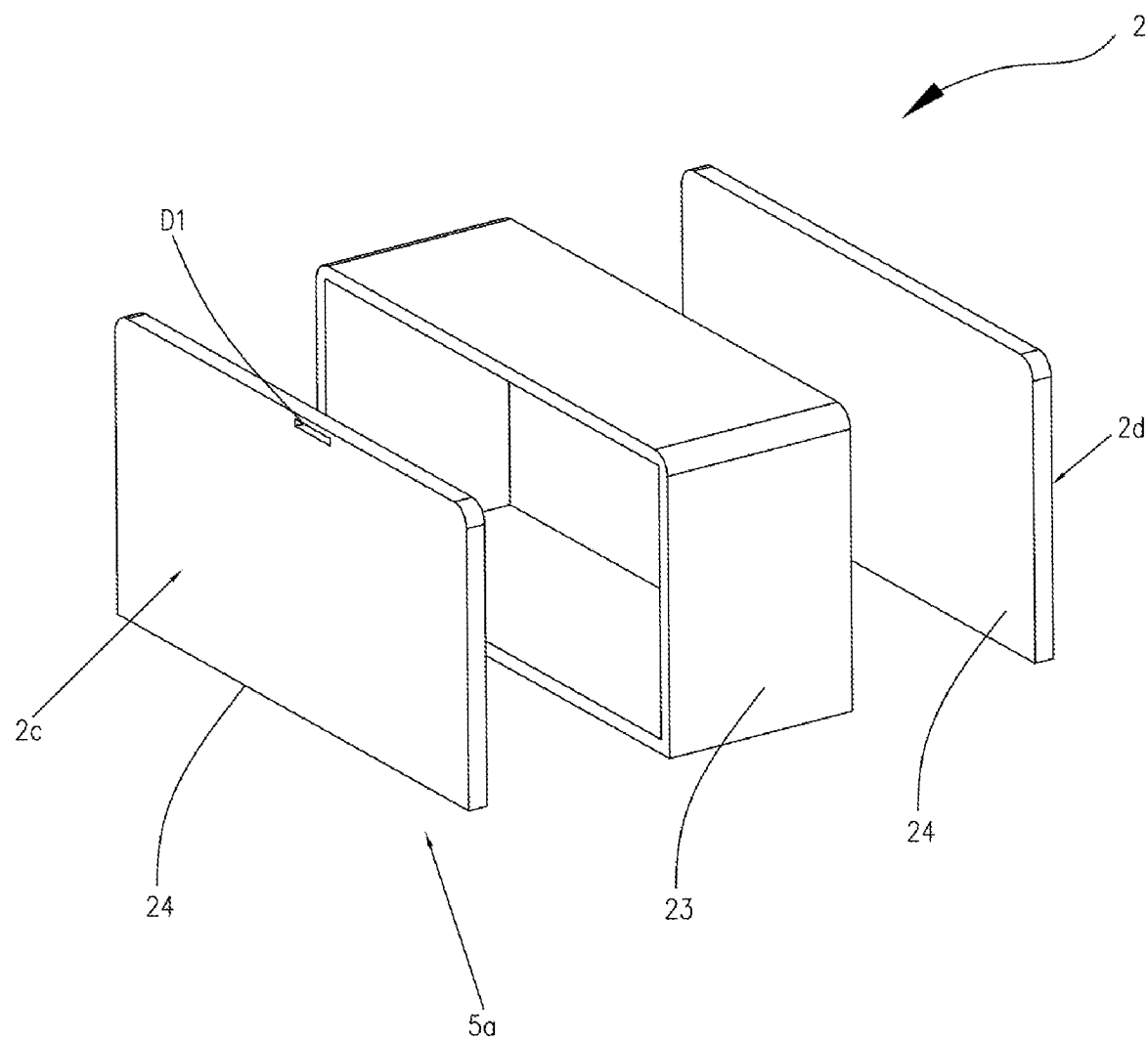
FIG. 14 is a schematic diagram illustrating another sliding seat illustrated in FIG. 2.
Figure 15:
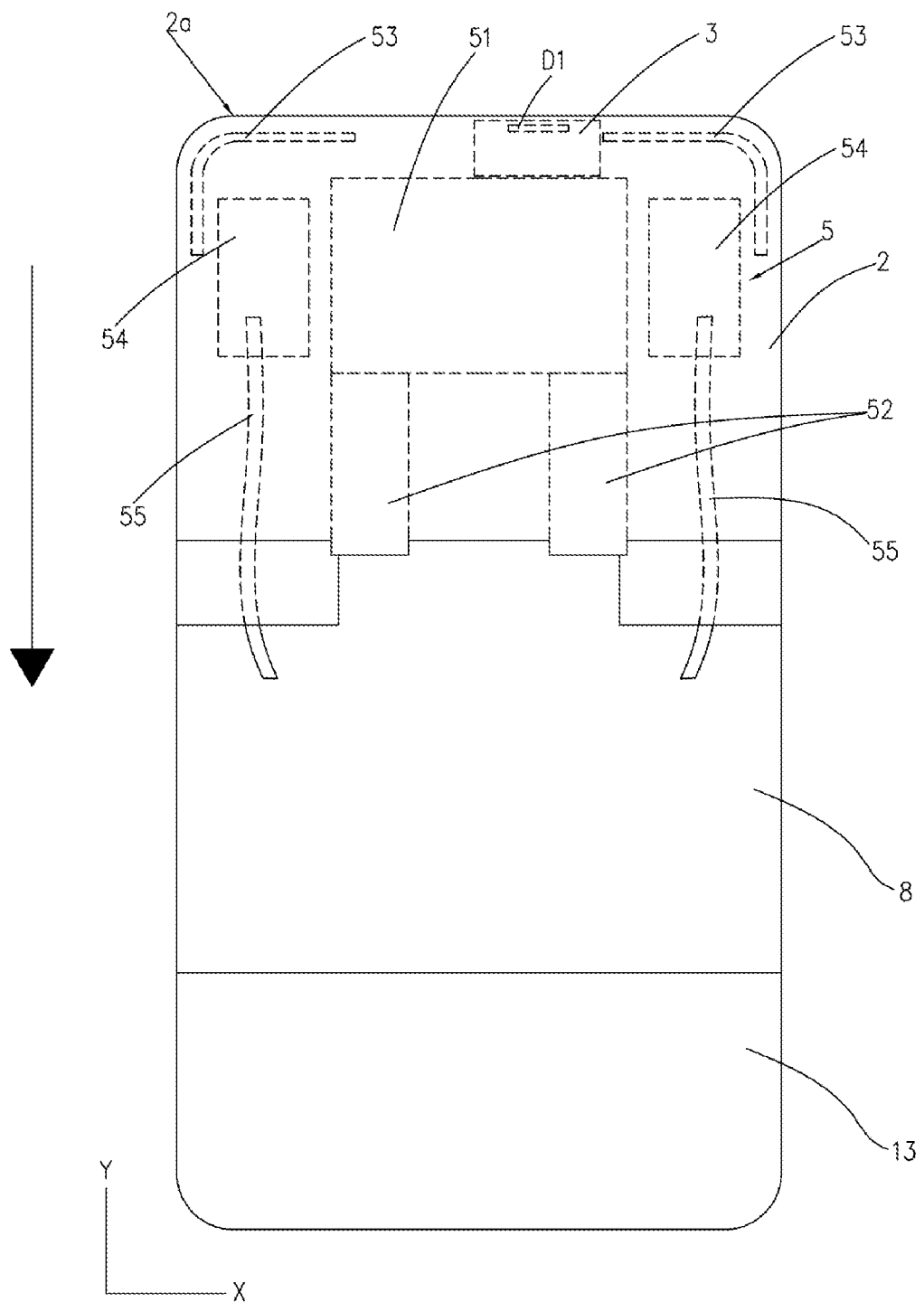
FIG. 15 is a schematic diagram illustrating an arrangement of functional components of a sliding seat of an electronic device in a retracting-state according to an implementation of the present disclosure.
Figure 16:
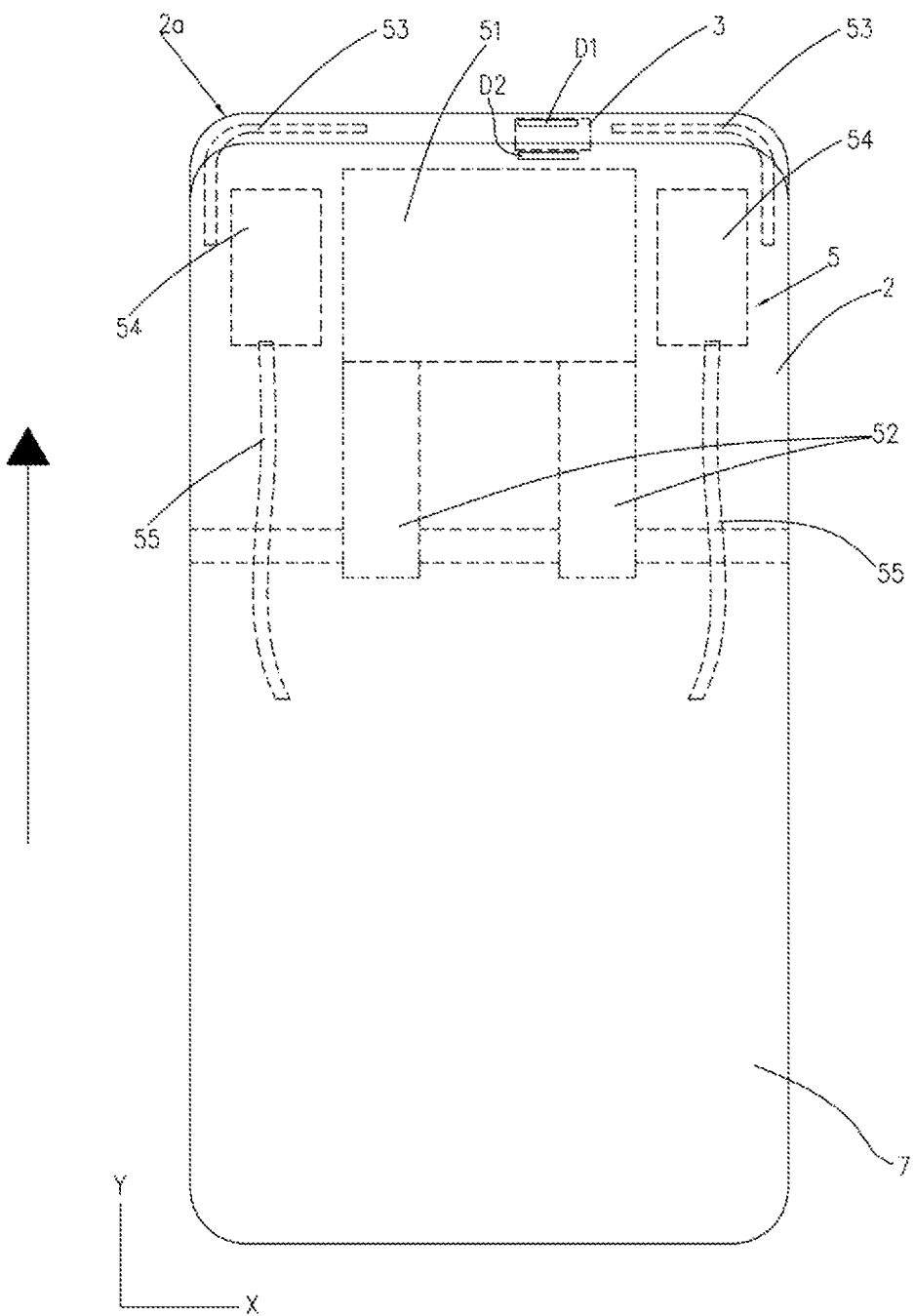
FIG. 16 is a schematic diagram illustrating the electronic device of FIG. 15 in an extending-state.

Referring to FIG. 13 to FIG. 16, when one of the multiple functional components 5 is required for work, the sliding seat 2 can slide to the extending-state accordingly. In this case, one of the at least one functional portion 5a of the sliding seat 2 is no longer occluded by the display screen. Said one of the multiple functional components 5 corresponding to said one of the at least one functional portion 5a can transmit a signal to the outside. For example, the multiple functional components 5 can include a front-facing camera component. A front-facing camera is a common feature of cameras, mobile phones, smartphones, and tablets. Tablets and smartphones and similar mobile devices have their front-facing camera on the front to allow taking a self-portrait photograph or video while looking at the display of the device, usually showing a live preview of the image. Front-facing cameras are therefore an important development for videotelephony and the taking of selfies. Accordingly, the functional portion 5a corresponding to the front-facing camera component is a front-facing light-transmitting portion which can transmit light to the front-facing camera component. Referring to FIG. 16, when a front-facing camera function is needed to work, slide the sliding seat 2 to make the sliding seat 2 be in the extending-state, such that a camera function (such as taking pictures) of the front-facing camera component can be achieved via the front-facing light-transmitting portion. Referring to FIG. 15, when it is unnecessary to use the front-facing camera function, slide the sliding seat 2 to make the sliding seat 2 be in the retracting-state, which facilitates accommodation of the electronic device.

Referring to FIG. 13 and FIG. 14, the functional portion 5*a* of the sliding seat 2 is mainly disposed on the first sliding surface 2*c* and the second sliding surface 2*d* which are disposed opposite to each other on the sliding seat 2 in the Z-direction. The arrangement of the functional portion 5*a* on the sliding surfaces of the sliding seat 2 varies with the functional component 5 to which the functional portion 5*a* corresponds.

It can be understood that, a structure of the sliding seat 2 includes but not limited to the following.

In one implementation, as illustrated in FIG. 13, the sliding seat 2 has a body 21 and at least one light-transmitting plate 22. The body 21 defines at least one functional hole 21*a*. One of the at least one light-transmitting plate 22 is disposed in one of the at least one functional hole 21*a* to form one of the functional portions 5*a*.

The sliding seat 2 thus structured is partially provided with the functional portion 5*a* (such as the light-transmitting plate 22 or a hole), which results in low cost. In addition, most part of the sliding seat 2 is made of metal and is therefore of high strength.

In another implementation, as illustrated in FIG. 14, the sliding seat 2 includes a sliding frame 23 and two sliding plates 24. The sliding frame 23 is made of a conductive material. One sliding plate 24 covers one side of the sliding frame 23 and the other sliding plate 24 covers the other side of the sliding frame 23 to define an inner cavity of the sliding seat 2 to accommodate the multiple functional components 5. The two sliding plates 24 are made of a light-transmitting material to form the at least one functional portion 5*a*.

The first sliding surface 2*c* and the second sliding surface 2*d* of the sliding seat 2 are both made of glass. Since the first sliding surface 2*c* and the second sliding surface 2*d* are both made of glass, the first sliding surface 2*c* and the second sliding surface 2*d* can function as a light-transmitting functional portion 5*a*. When the camera assembly 51 or a light sensor of the sliding seat 2 is needed to work, as long as the sliding seat 2 is moved out of the accommodating groove 12*d*, light from outside can be transmitted through the first sliding surface 2*c* or the second sliding surface 2*d*, thereby ensuring that the camera assembly 51 or the light sensor can work reliably.

The sliding seat 2 thus structured has two surfaces made of glass, which facilitates light transmission of the multiple functional components 5 of the sliding seat 2 without providing the functional portion(s) 5*a* in a corresponding position(s).

It should be understood that, the at least one functional component 5 includes a camera assembly 51 and an electrical connector 52. The electrical connector 52 has one end electrically connected with both the camera assembly 51 and the receiver 3, and the electrical connector 52 has the other end extending from the sliding seat 2 to be electrically connected with a mainboard 8 of the frame 1.

As illustrated in FIG. 15, the camera assembly 51 and the receiver 3 are disposed side by side. The camera assembly 51 is mainly located in the middle of the sliding seat 2. The receiver 3 is disposed adjacent to the first wall 2*a* of the sliding seat 2, to achieve sound signal output of the receiver 3 when the first wall 2*a* of the sliding seat 2 exposes from the top wall 12*a*.

Referring to FIG. 15, the flexible electrical connector 52 and the camera assembly 51 are disposed side by side in the Y-direction of the electronic device. The flexible electrical connector 52 includes two flexible electrical connectors which are arranged along the X-direction of the electronic device. The two flexible electrical connectors 52 are disposed adjacent to the second wall 2*b* of the sliding seat 2, which enables the two flexible electrical connectors 52 to extend from the sliding seat 2 to be electrically connected with a circuit board of the electronic device, thus further optimizing internal space of the electronic device.

The camera assembly 51 and the receiver 3 are both electrically connected with the two flexible electrical connectors 52, thereby optimizing arrangement of flexible circuit boards inside the sliding seat 2 and saving space.

It can be understood that, the camera assembly 51 can include but is not limited to the following components: at least one of a front-facing camera assembly, a rear camera assembly, and a flashlight.

It can be understood that, the flexible electrical connector 52 is a winding flexible circuit board. When the sliding seat 2 slides, the flexible electrical connector 52 extends or winds.

The multiple functional components 5 of the sliding seat 2 are electrically connected with the mainboard 8 of the frame 1 via the flexible electrical connector 52, as such, when the sliding seat 2 slides, an electrical signal(s) of the multiple functional components 5 will not be interrupted and the multiple functional components 5 can still work normally, thereby further improving reliability of the electronic device 100. The flexible electrical connector 52 is embodied a winding flexible circuit board to make the flexible electrical connector 52 deform with different states of the sliding seat 2, that is, when the flexible electrical connector 52 winds, the flexible electrical connector 52 occupies only a small area.

Referring to FIG. 16, when the sliding seat 2 is in an extending-state, the flexible electrical connector 52 is extended to the longest. Referring to FIG. 15, when the sliding seat 2 is in a retracting-state, the flexible electrical connector 52 winds in a roll and thus occupies less space of the electronic device.

It should be understood that, as illustrated in FIG. 15 and FIG. 16, the multiple functional components 5 further include a radiating body 53 of an antenna, a secondary circuit board 54, and a cable 55. The radiating body 53 is disposed adjacent to an edge of the sliding seat 2. The radiating body 53 is electrically coupled with one end of the cable 55 via the secondary circuit board 54, to enable transmission and reception of signals. The cable 55 has the other end extending from the sliding seat 2 to be electrically connected with the mainboard 8 of the frame 1. It is understood, the radiating body 53 is a part of the antenna, and, besides the radiating body 53, the antenna further includes circuits disposed on the mainboard.

The radiating body 53 is electrically coupled with the mainboard 8 via the cable 55 rather than via the flexible electrical connector 52, to prevent an electrical signal of the radiating body 53 from being interrupted by other functional components 5, thereby further enhancing radiation of the radiating body 53.

Referring to FIG. 15, the radiating body 53 is disposed adjacent to the first wall 2*a* of the sliding seat 2, which decreases probability of occlusion by user's hand when the radiating body 53 radiates signals, thereby ensuring that the radiating body 53 has better radiation performance.

A structure of the cable 55 makes the cable 55 seldom wind or be extended when the sliding seat 2 slides, thereby ensuring transmission of electrical signals between the radiating body 53 and the mainboard 8.

Referring to FIG. 15, the secondary circuit board 54 includes two said secondary circuit boards, and the cable 55 accordingly includes two said cables. One of the two secondary circuit boards 54 is located on one side of the camera assembly 51, and the other one of the two secondary circuit boards 54 is located on the other one side of the camera assembly 51. One of the two secondary circuit boards 54 is provided with a matching circuit electrically connected with the radiating body 53. The cables 55 are electrically connected between the two secondary circuit boards 54 and the mainboard 8.

As illustrated in FIG. 16, the radiating body 53 is disposed in the sliding seat 2. When the sliding seat 2 is in the extending-state, since the radiating body 53 is not further occluded by the display screen or a back plate, the radiating body 53 has better radiation performance. Therefore, by sliding the sliding seat 2 out of the accommodating groove 12d, stronger signals can be obtained, if necessary.

According to the electronic device, the receiver 3 is disposed in the sliding seat 2, and the sliding seat 2 is able to slide relative to the frame 1 and defines the first receiving hole D1. When the receiver 3 is needed to work, the sliding seat 2 slides out of the frame 1, so that the sound signal of the receiver 3 can be transmitted to outside through the first receiving hole D1. That is, the first receiving hole D1 does not need to be disposed on the display screen of the electronic device 100, which is beneficial to improving the screen-to-body ratio of the electronic device 100.

Figure 17:
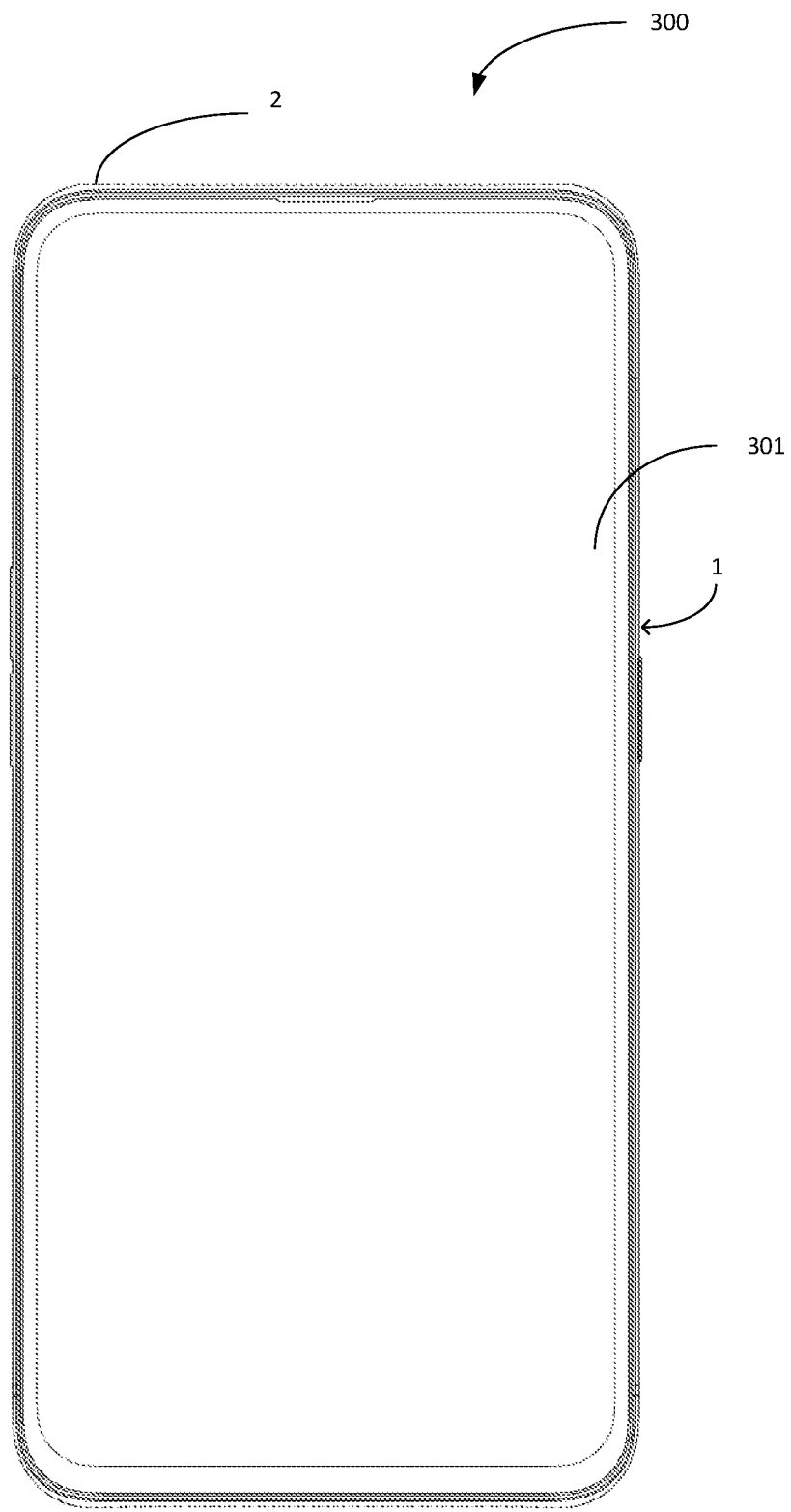
FIG. 17 is a schematic diagram illustrating a terminal device according to an implementation of the disclosure.

FIG. 17 is a schematic diagram illustrating a terminal device 300 according to an implementation of the disclosure. The terminal device 300 includes the electronic device described above and a display module 301. The display module 301 covers the frame 1 and is disposed opposite the sliding seat 2. For details not revealed, reference can be made to the description in the foregoing implementations and the disclosure will not be repeated herein.

Figure 18:
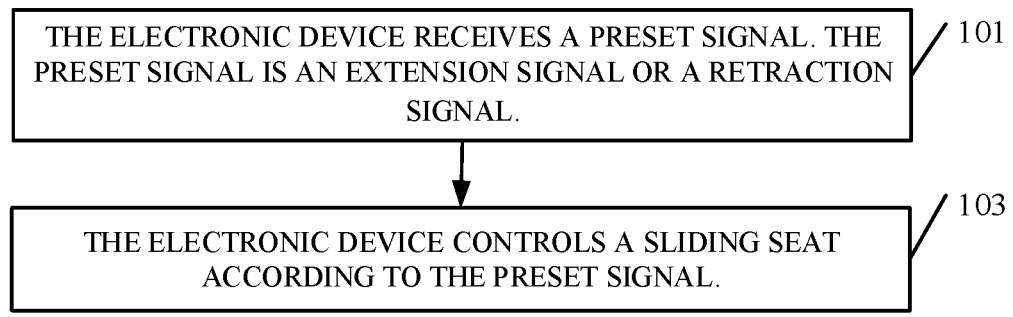
FIG. 18 is a schematic flowchart illustrating a method for controlling an electronic device according to an implementation of the present disclosure.

FIG. 18 is a schematic flowchart illustrating a method for controlling an electronic device according to an implementation of the present disclosure. The method can be applicable to but is not limited to the electronic device of Implementation 1 and the electronic device of Implementation 2 described above. The method includes the following.

At block 101, the electronic device receives a preset signal. The preset signal is an extension signal or a retraction signal. The extension signal is configured to indicate a sliding seat to extend from an accommodating groove. The retraction signal is configured to indicate the sliding seat to retract into the accommodating groove.

At block 103, the electronic device controls a sliding seat according to the preset signal.

The electronic device controls the sliding seat according to the preset signal as follows. When the preset signal is the extension signal, the electronic device controls, according to the preset signal, the sliding seat to extend from the accommodating groove. When the preset signal is the retraction signal, the electronic device controls, according to the preset signal, the sliding seat to retract into the accommodating groove.

It can be understood that, the extension signal or the retraction signal received by the electronic device can be input through voice, text, touch, etc. by a user. After the electronic device receives the extension signal, the electronic device will be in an extending-state.

The method is applicable to the above electronic device which is beneficial to improving the screen-to-body ratio of the electronic device.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An electronic device, comprising a frame, a sliding seat, and a receiver accommodated in the sliding seat;

the frame comprising a pair of side walls oppositely disposed and a top wall, the top wall defining an accommodating groove, and the accommodating groove extending through the pair of side walls; and the sliding seat being slidably disposed in the accommodating groove of the frame, the sliding seat defining a first receiving hole, and the receiver being sealed and covering the first receiving hole of the sliding seat, whereby a sound signal of the receiver is transmitted to outside through the first receiving hole when the sliding seat extends from the accommodating groove.

2. The electronic device of claim 1, wherein the frame defines a second receiving hole, and the second receiving hole communicates with the first receiving hole when the sliding seat is accommodated in the accommodating groove, whereby the sound signal of the receiver is output to the second receiving hole via the first receiving hole when the sliding seat is accommodated in the accommodating groove.

3. The electronic device of claim 2, wherein the electronic device further comprises a sound-transmission assembly, the sound-transmission assembly has an inner cavity, and the first receiving hole communicates with the second receiving hole via the inner cavity, whereby the sound signal of the receiver is transmitted through the first receiving hole, the inner cavity, and the second receiving hole.

4. The electronic device of claim 3, wherein the sound-transmission assembly comprises a sound-transmission tube, a first magnetic member, a second magnetic member, and a third magnetic member, wherein the sound-transmission tube has one end fixedly coupled with the sliding seat and communicating with the first receiving hole, the first magnetic member is disposed on the other end of the sound-transmission tube, the second magnetic member is disposed on the frame and surrounds the second receiving hole, the third magnetic member is disposed on the sliding seat, and a magnetic force between the first magnetic member and the second magnetic member is greater than a magnetic force between the first magnetic member and the third magnetic member, whereby the other end of the sound-transmission tube communicates with the second receiving hole because of magnetic attraction of the first magnetic member and the second magnetic member when the sliding seat is accommodated in the accommodating groove, or the other end of the sound-transmission tube is attached to the sliding seat because of magnetic attraction of the first magnetic member and the third magnetic member when the sliding seat extends from the accommodating groove.

5. The electronic device of claim 3, wherein the sound-transmission assembly is a sound-transmission rod, the sound-transmission rod protrudes from the sliding seat and surrounds the first receiving hole, and the sound-transmission rod has an end extending in a direction away from the sliding seat, whereby the end of the sound-transmission rod abuts against the frame and surrounds the second receiving hole when the sliding seat is accommodated in the accommodating groove.

6. The electronic device of claim 2, wherein an area of orthographic projection of the second receiving hole on the sliding seat is within an area occupied by the first receiving hole in the sliding seat.

7. The electronic device of claim 2, wherein an edge of the top wall of the frame is notched to define the second receiving hole.

8. The electronic device of claim 1, wherein the sliding seat has a first wall, the first wall is parallel to and close to the top wall, the first receiving hole has a first opening and a second opening disposed opposite each other, the first opening is located on an inner surface of the sliding seat, and the second opening gradually extends away from the first opening and gradually approaches the first wall.

9. The electronic device of claim 1, wherein the electronic device further comprises a bracket and a sealing member, the sealing member has a hollow portion and is disposed between the receiver and the sliding seat, the hollow portion communicates with a vibration portion of the receiver and the first receiving hole of the sliding seat respectively, and the bracket is pressed on the receiver, whereby the sealing member is sandwiched between the receiver and the sliding seat.

10. The electronic device of claim 9, wherein the bracket has a first connecting portion, a pressing portion, and a second connecting portion which are sequentially connected, the pressing portion covers the receiver, and the first connecting portion and the second connecting portion both extend in a direction away from the pressing portion and are fixedly connected with the sliding seat.

11. The electronic device of claim 1, wherein the electronic device further includes an elastic member and an adhesive, the elastic member is adhered between the receiver and the sliding seat via the adhesive, and the elastic member has a hollowed-out portion, and the hollowed-out portion communicates with a vibration portion of the receiver and the first receiving hole of the sliding seat respectively.

12. The electronic device of claim 11, wherein the elastic member is made of foam, the adhesives are provided on two opposite walls of the elastic member, one of the two walls of the elastic member is adhered to the receiver via the adhesive, and the other of the two walls of the elastic member is adhered to the sliding seat via the adhesive.

13. The electronic device of claim 1, wherein the electronic device further comprises at least one functional component, the at least one functional component is disposed in the sliding seat, and the sliding seat is provided with at least one functional portion, the at least one functional component is able to transmit a signal through the at least one functional portion.

14. The electronic device of claim 13, wherein the at least one functional component comprises a camera assembly and an electrical connector, the electrical connector has one end electrically connected with both the camera assembly and the receiver, and the electrical connector has the other end extending from the sliding seat to be electrically connected with a mainboard of the frame.

15. The electronic device of claim 14, wherein the electrical connector is a winding flexible circuit board, and the electrical connector extends or winds when the sliding seat slides, wherein the at least one functional component further comprises a radiating body of an antenna, a secondary circuit board, and a cable, wherein the radiating body is disposed adjacent to an edge of the sliding seat and is electrically connected with one end of the cable via the secondary circuit board, and the cable has the other end extending from the sliding seat to be electrically connected with the mainboard of the frame.

16. The electronic device of claim 13, wherein the sliding seat has a body and at least one light-transmitting plate, the body defines at least one functional hole, and one of the at least one light-transmitting plate is disposed in one of the at least one functional hole to form one of the at least one functional portion.

17. A terminal device, comprising an electronic device and a display module;
    the electronic device comprising a frame, a sliding seat, and a receiver accommodated in the sliding seat;
        the frame comprising a pair of side walls oppositely disposed and a top wall connected between the pair of side walls' end-surfaces, the top wall defining an accommodating groove, and the accommodating groove extending through the pair of side walls; and
        the sliding seat being slidably disposed in the accommodating groove of the frame; the sliding seat defining a first receiving hole, and the receiver being sealed and covering the first receiving hole of the sliding seat, whereby a sound signal of the receiver is transmitted to outside through the first receiving hole when the sliding seat extends from the accommodating groove; and
    the display module covering the frame, and being disposed opposite the sliding seat.

18. The terminal device of claim 17, wherein the frame defines a second receiving hole, and the second receiving hole communicates with the first receiving hole when the sliding seat is accommodated in the accommodating groove, whereby the sound signal of the receiver is output to the second receiving hole via the first receiving hole when the sliding seat is accommodated in the accommodating groove.

19. The terminal device of claim 17, wherein the sliding seat has a first wall, the first wall is parallel to and close to the top wall, the first receiving hole has a first opening and a second opening disposed opposite each other, the first opening is located on an inner surface of the sliding seat, and the second opening gradually extends away from the first opening and gradually approaches the first wall.

* * * * *

UNITED STATES PATENT AND TRADEMARK OFFICE
CERTIFICATE OF CORRECTION

PATENT NO. : 11,221,650 B2  
APPLICATION NO. : 16/365960  
DATED : January 11, 2022  
INVENTOR(S) : Sun et al.

It is certified that error appears in the above-identified patent and that said Letters Patent is hereby corrected as shown below:

On the Title Page

(30) Foreign Application Priority Data:  
Insert -- March 31, 2018          (CN) ..................201810282609.0 --

Signed and Sealed this  
Twenty-ninth Day of March, 2022

Drew Hirshfeld  
*Performing the Functions and Duties of the  
Under Secretary of Commerce for Intellectual Property and  
Director of the United States Patent and Trademark Office*